(12) United States Patent
Haba et al.

(10) Patent No.: US 12,341,083 B2
(45) Date of Patent: Jun. 24, 2025

(54) ELECTRONIC DEVICE COOLING STRUCTURES BONDED TO SEMICONDUCTOR ELEMENTS

(71) Applicant: ADEIA SEMICONDUCTOR BONDING TECHNOLOGIES INC., San Jose, CA (US)

(72) Inventors: Belgacem Haba, Saratoga, CA (US); Gaius Gillman Fountain, Jr., Youngsville, NC (US); Thomas Workman, San Jose, CA (US); Kyong-Mo Bang, Fremont, CA (US); Ron Zhang, Sunnyvale, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/398,984

(22) Filed: Dec. 28, 2023

(65) Prior Publication Data

US 2024/0266255 A1    Aug. 8, 2024

Related U.S. Application Data

(60) Provisional application No. 63/483,944, filed on Feb. 8, 2023.

(51) Int. Cl.
*H01L 23/473* (2006.01)
*H01L 21/48* (2006.01)
*H01L 23/00* (2006.01)

(52) U.S. Cl.
CPC ...... *H01L 23/4735* (2013.01); *H01L 21/4871* (2013.01); *H01L 24/08* (2013.01);
(Continued)

(58) Field of Classification Search
CPC ............. H01L 23/4735; H01L 21/4871; H01L 21/4882; H01L 24/08; H01L 24/80;
(Continued)

(56) References Cited

U.S. PATENT DOCUMENTS 4,274,479 A    6/1981   Eastman
5,309,986 A    5/1994   Itoh
(Continued)

FOREIGN PATENT DOCUMENTS

CN    109524373 A    3/2019
CN    111128976 B    10/2021
(Continued)

OTHER PUBLICATIONS

International Search Report and Written Opinion mailed Jun. 5, 2024, in International Application No. PCT/US2024/013758, 11 pages.
(Continued)

*Primary Examiner* — Didarul A Mazumder
(74) *Attorney, Agent, or Firm* — Haley Guiliano LLP

(57) ABSTRACT

A cooling structure having a first side and a second side opposite the first side can be formed through a method comprising, forming an inlet and an outlet in a first substrate, forming at least one channel on the second side of the first substrate, wherein the at least one channel is in fluid communication with the inlet and outlet, forming a plurality of nozzles on the first side of a second substrate, and forming a plurality of channels on the second side of the second substrate opposite the first side of the second substrate. The plurality of channels is aligned with the plurality of nozzles, and the second side of the first substrate is bonded to the first side of the second substrate.

12 Claims, 7 Drawing Sheets

(52) U.S. Cl.
CPC .... *H01L 24/80* (2013.01); *H01L 2224/08221* (2013.01); *H01L 2224/80896* (2013.01)

(58) Field of Classification Search
CPC . H01L 2224/08221; H01L 2224/80896; H01L 23/473; H01L 23/367; H01L 2224/08238
USPC ........................................................ 257/713
See application file for complete search history.

(56) References Cited

U.S. PATENT DOCUMENTS

| | | |
|---|---|---|
| 5,522,452 A | 6/1996 | Mizuno et al. |
| 5,753,536 A | 5/1998 | Sugiyama et al. |
| 5,769,154 A | 6/1998 | Adkins et al. |
| 5,771,555 A | 6/1998 | Eda et al. |
| 6,056,044 A | 5/2000 | Benson et al. |
| 6,080,640 A | 6/2000 | Gardner et al. |
| 6,351,384 B1 | 2/2002 | Daikoku et al. |
| 6,423,640 B1 | 7/2002 | Lee et al. |
| 6,465,892 B1 | 10/2002 | Suga |
| 6,686,532 B1 | 2/2004 | Macris |
| 6,822,326 B2 | 11/2004 | Enquist et al. |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,105,980 B2 | 9/2006 | Abbott et al. |
| 7,193,423 B1 | 3/2007 | Dalton et al. |
| 7,289,326 B2 | 10/2007 | Heydari et al. |
| 7,485,957 B2 | 2/2009 | Brandenburg et al. |
| 7,511,372 B2 | 3/2009 | Chiu |
| 7,523,617 B2 | 4/2009 | Venkatasubramanian et al. |
| 7,622,324 B2 | 11/2009 | Enquist et al. |
| 7,692,926 B2 | 4/2010 | Henderson et al. |
| 7,750,488 B2 | 7/2010 | Patti et al. |
| 7,803,693 B2 | 9/2010 | Trezza |
| 7,957,137 B2 | 6/2011 | Prasher |
| 7,978,473 B2 | 7/2011 | Campbell et al. |
| 7,997,087 B2 | 8/2011 | Venkatasubramanian et al. |
| 8,164,169 B2 | 4/2012 | Chrysler et al. |
| 8,183,127 B2 | 5/2012 | Patti et al. |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,630,091 B2 | 1/2014 | Ward et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,673 B2 | 12/2015 | Chen et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,641 B2 | 3/2016 | Sekar et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,355,932 B2 | 5/2016 | Ankireddi et al. |
| 9,385,024 B2 | 7/2016 | Tong et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,553,071 B1 | 1/2017 | Haba |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,741,638 B2 | 8/2017 | Hsieh et al. |
| 9,741,696 B2 | 8/2017 | Katkar et al. |
| 9,746,248 B2 | 8/2017 | Semenov et al. |
| 9,768,149 B2 | 9/2017 | Vadhavkar et al. |
| 9,799,587 B2 | 10/2017 | Fujii et al. |
| 9,818,723 B2 | 11/2017 | Haba |
| 9,852,988 B2 | 12/2017 | Enquist et al. |
| 9,893,004 B2 | 2/2018 | Yazdani |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,032,695 B2 | 7/2018 | Iyengar et al. |
| 10,075,657 B2 | 9/2018 | Fahim et al. |
| 10,083,934 B2 | 9/2018 | Haba |
| 10,170,392 B2 | 1/2019 | Chainer et al. |
| 10,199,356 B2 | 2/2019 | Kinsley |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,312,221 B1 | 6/2019 | Agarwal et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,461,059 B2 | 10/2019 | Koopmans et al. |
| 10,508,030 B2 | 12/2019 | Katkar et al. |
| 10,522,499 B2 | 12/2019 | Enquist et al. |
| 10,694,641 B2 | 6/2020 | Basu et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,978,427 B2 | 4/2021 | Li et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,187,469 B2 | 11/2021 | Karesh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,296,053 B2 | 4/2022 | Uzoh et al. |
| 11,329,034 B2 | 5/2022 | Tao et al. |

(56) References Cited

U.S. PATENT DOCUMENTS

| | | |
|---|---|---|
| 11,348,898 B2 | 5/2022 | DeLaCruz et al. |
| 11,355,404 B2 | 6/2022 | Gao et al. |
| 11,355,443 B2 | 6/2022 | Huang et al. |
| 11,367,652 B2 | 6/2022 | Uzoh et al. |
| 11,387,202 B2 | 7/2022 | Haba et al. |
| 11,515,291 B2 | 11/2022 | DeLaCruz et al. |
| 11,598,594 B2 | 3/2023 | Lewis et al. |
| 11,996,351 B2 | 5/2024 | Hsiao et al. |
| 2004/0084414 A1 | 5/2004 | Sakai et al. |
| 2004/0184237 A1 | 9/2004 | Chang |
| 2004/0251530 A1 | 12/2004 | Yamaji |
| 2005/0126766 A1 | 6/2005 | Lee et al. |
| 2005/0213301 A1 | 9/2005 | Prasher |
| 2006/0042825 A1 | 3/2006 | Lu et al. |
| 2006/0057945 A1 | 3/2006 | Hsu et al. |
| 2006/0103011 A1 | 5/2006 | Andry et al. |
| 2007/0025082 A1 | 2/2007 | Lee et al. |
| 2007/0107875 A1 | 5/2007 | Lee et al. |
| 2007/0111386 A1 | 5/2007 | Kim et al. |
| 2008/0096320 A1 | 4/2008 | Farrar |
| 2009/0122491 A1 | 5/2009 | Martin et al. |
| 2010/0116534 A1 | 5/2010 | Choi et al. |
| 2010/0230805 A1 | 9/2010 | Refai-Ahmed |
| 2010/0300202 A1 | 12/2010 | Joyce |
| 2013/0044431 A1 | 2/2013 | Koeneman |
| 2013/0050944 A1 | 2/2013 | Shepard |
| 2013/0087904 A1 | 4/2013 | Clark et al. |
| 2014/0126150 A1 | 5/2014 | Song et al. |
| 2014/0175655 A1 | 6/2014 | Chen et al. |
| 2015/0064498 A1 | 3/2015 | Tong |
| 2015/0194363 A1 | 7/2015 | Jun et al. |
| 2016/0037680 A1* | 2/2016 | Hou ................. H05K 7/20345 361/699 |
| 2016/0276314 A1 | 9/2016 | Ching et al. |
| 2016/0343682 A1 | 11/2016 | Kawasaki |
| 2017/0012016 A1 | 1/2017 | Joshi et al. |
| 2017/0092565 A1 | 3/2017 | Chen et al. |
| 2017/0103937 A1 | 4/2017 | Hsieh et al. |
| 2018/0087842 A1 | 3/2018 | Chainer et al. |
| 2018/0090417 A1* | 3/2018 | Gutala ................. H01L 21/4882 |
| 2018/0090427 A1 | 3/2018 | Bernstein et al. |
| 2018/0160565 A1 | 6/2018 | Parida |
| 2018/0166359 A1* | 6/2018 | Fukuoka ................. H01L 23/367 |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0211900 A1 | 7/2018 | Gutala et al. |
| 2018/0219038 A1 | 8/2018 | Gambino et al. |
| 2018/0308783 A1 | 10/2018 | Refai-Ahmed et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0008071 A1 | 1/2019 | Kim |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0364691 A1* | 11/2019 | Subrahmanyam ........................... H05K 7/20518 |
| 2019/0385928 A1 | 12/2019 | Leobandung |
| 2019/0385935 A1 | 12/2019 | Gao et al. |
| 2019/0385966 A1 | 12/2019 | Gao et al. |
| 2019/0393117 A1* | 12/2019 | Vockenberger ....... H01L 23/367 |
| 2020/0013637 A1 | 1/2020 | Haba |
| 2020/0013765 A1 | 1/2020 | Fountain, Jr. et al. |
| 2020/0035583 A1 | 1/2020 | Beauchemin et al. |
| 2020/0035641 A1 | 1/2020 | Fountain, Jr. et al. |
| 2020/0105639 A1 | 4/2020 | Valavala et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0294908 A1 | 9/2020 | Haba et al. |
| 2020/0312742 A1 | 10/2020 | Lofgreen et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0343160 A1* | 10/2020 | Mizerak ................. H05K 7/205 |
| 2020/0350233 A1 | 11/2020 | Mizerak et al. |
| 2020/0352053 A1 | 11/2020 | Mizerak et al. |
| 2020/0371154 A1 | 11/2020 | DeLaCruz et al. |
| 2020/0395313 A1 | 12/2020 | Mallik et al. |
| 2020/0395321 A1 | 12/2020 | Katkar et al. |
| 2021/0066164 A1 | 3/2021 | Wu et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0175143 A1 | 6/2021 | Yu et al. |
| 2021/0181510 A1 | 6/2021 | Katkar et al. |
| 2021/0183741 A1 | 6/2021 | Jha et al. |
| 2021/0193548 A1 | 6/2021 | Wan et al. |
| 2021/0193603 A1 | 6/2021 | Katkar et al. |
| 2021/0193620 A1 | 6/2021 | Refai-Ahmed et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0280497 A1 | 9/2021 | Brun et al. |
| 2021/0288037 A1 | 9/2021 | Tao et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0378106 A1 | 12/2021 | Iyengar et al. |
| 2021/0378139 A1 | 12/2021 | Rice et al. |
| 2021/0407941 A1 | 12/2021 | Haba |
| 2021/0410329 A1 | 12/2021 | Yang et al. |
| 2022/0037231 A1 | 2/2022 | Hsiao et al. |
| 2022/0077063 A1 | 3/2022 | Haba |
| 2022/0077087 A1 | 3/2022 | Haba |
| 2022/0087059 A1 | 3/2022 | Sathyamurthy et al. |
| 2022/0117115 A1 | 4/2022 | Malouin et al. |
| 2022/0130734 A1 | 4/2022 | Chiu et al. |
| 2022/0139867 A1 | 5/2022 | Uzoh |
| 2022/0139869 A1 | 5/2022 | Gao et al. |
| 2022/0189850 A1 | 6/2022 | Liff et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0210949 A1 | 6/2022 | Edmunds et al. |
| 2022/0230937 A1 | 7/2022 | Malouin et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0408592 A1 | 12/2022 | Malouin et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0048500 A1 | 2/2023 | Malouin et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0156959 A1 | 5/2023 | Malouin et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |

(56) References Cited

U.S. PATENT DOCUMENTS

| | | |
|---|---|---|
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0284421 A1 | 9/2023 | Malouin et al. |
| 2023/0298969 A1 | 9/2023 | Park et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038633 A1 | 2/2024 | Haba et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203823 A1 | 6/2024 | Uzoh et al. |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222222 A1 | 7/2024 | Haba et al. |
| 2024/0222226 A1 | 7/2024 | Haba |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0249995 A1 | 7/2024 | Haba |
| 2024/0249998 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |

FOREIGN PATENT DOCUMENTS

| | | |
|---|---|---|
| CN | 115719735 A | 2/2023 |
| JP | 2000-340727 A | 12/2000 |
| JP | 2013-033786 A | 2/2013 |
| JP | 2018-160519 | 10/2018 |
| KR | 101049508 B1 | 8/2011 |
| KR | 10-2023-0136509 | 9/2023 |
| TW | 200834871 A | 8/2008 |
| WO | WO 2005/043584 A2 | 5/2005 |
| WO | WO 2013/097146 | 7/2013 |

OTHER PUBLICATIONS

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Colgan, Evan G., "A practical implementation of silicon microchannel coolers," Electronics Cooling, Nov. 1, 2007, http://www.electronics-cooling.com/2007/11/a-practical-implementation-of-silicon-microchannel-coolers, printed May 23, 2023, 12 pages.

Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 6 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.

"Microconvective Liquid Cooling for high power electronics," https://jetcool.com/technology/, downloaded Mar. 7, 2024, 6 pages.

Moriceau, H. et al., "Overview of recent direct wafer bonding advances and applications," Advances in Natural Sciences-Nanoscience and Nanotechnology, 2010, 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820.".

Plobi, A. et al., "Wafer direct bonding: tailoring adhesion between brittle materials," Materials Science and Engineering Review Journal, 1999, R25, 88 pages.

"Single-Phase Direct-to-Chip Liquid Cooling," 13 pages, downloaded from https://jetcool.com/post/single-phase-direct-to-chip-liquid-cooling-microconvective-vs-microchannel-liquid-cooled-cold-plates/ on Mar. 7, 2024.

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes No. representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."

Walsh, Stephen Michael, "Microjet Impingement Cooling of High Power-Density Electronics," Thesis, submitted May 11, 2018, 93 pages.

Benson D.A. et al., "Micro-Machined Heat Pipes in Silicon MCM Substrates", Sandia National Laboratories, Sandia Report: SAND97-0100-UC-704, printed Jan. 1997, 17 pages.

IBM, "Functional electronic packaging-Thermal management roadmap", available online at <https://web.archive.org/web/20170220095511/https://www.zurich.ibm.com/st/electronicpackaging/cooling.html>, Feb. 20, 2017, 8 pages.

Kaplan et al., "LoCool: Fighting Hot Spots Locally for Improving System Energy Efficiency". IEEE Transactions on Computer-Aided Design of Integrated Circuits and Systems, 39(4):895-908 (2020).

Shamsa et al., "Thermal conductivity of diamond-like carbon films". Applied Physics Letters, vol. 89, No. 16, Oct. 16, 2006, pp. 161921-161921-3.

International Search Report and Written Opinion received for PCT Patent Application No. PCT/US2023/028942, mailed on Nov. 16, 2023, 12 pages.

International Search Report and Written Opinion received for PCT Patent Application No. PCT/US2023/084874, mailed on Apr. 22, 2024, 7 pages.

International Search Report and Written Opinion received for PCT Patent Application No. PCT/US2023/085801, mailed on Apr. 26, 2024, 8 pages.

(56) References Cited

OTHER PUBLICATIONS

International Search Report and Written Opinion received for PCT Patent Application No. PCT/US2023/085816, mailed on Apr. 23, 2024, 11 pages.
International Search Report and Written Opinion received for PCT Patent Application No. PCT/US2023/086233, mailed on Apr. 26, 2024, 7 pages.
International Search Report and Written Opinion received for PCT Application No. PCT/US2024/022253, mailed on Jul. 17, 2024, 10 pages.

* cited by examiner

ELECTRONIC DEVICE COOLING STRUCTURES BONDED TO SEMICONDUCTOR ELEMENTS

CROSS-REFERENCE TO RELATED APPLICATIONS

This application claims priority to U.S. Provisional Application No. 63/483,944, filed Feb. 8, 2023, titled "SEMICONDUCTOR DEVICE COOLING STRUCTURES," the disclosure of which is incorporated herein by reference in its entirety for all purposes.

BACKGROUND

Field

This disclosure relates to electronic device cooling structures. Some embodiments relate to directly bonded structures.

Description of Related Art

Cooling structures may be disposed over and bonded to semiconductor elements (such as integrated device dies) and utilize a liquid or coolant to be flowed through cavities or channels within the cooling structures. The cooling structures can be bonded to the semiconductor elements or integrated device dies to be cooled. Pumps can be used to help facilitate the flow of liquid through the cooling structure.

BRIEF DESCRIPTION OF THE DRAWINGS

These and other features, aspects, and advantages of the disclosure are described with reference to drawings of certain embodiments, which are intended to illustrate, but not to limit, the present disclosure. It is to be understood that the accompanying drawings, which are incorporated in and constitute a part of this specification, are for the purpose of illustrating concepts disclosed herein and may not be to scale.

Like reference numbers are used to refer to like features throughout the description and drawings.

DETAILED DESCRIPTION

Figure 1A:
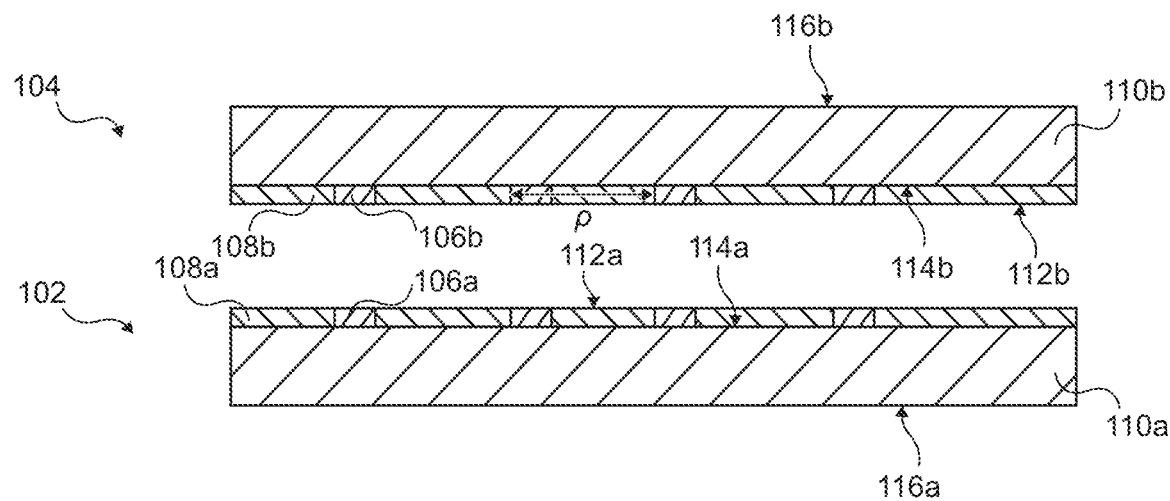
FIGS. 1A-1B are schematic cross sections illustrating a direct bonding process according to some embodiments.

Although several embodiments, examples, and illustrations are disclosed below, it will be understood by those of ordinary skill in the art that the inventions described herein extend beyond the specifically disclosed embodiments, examples, and illustrations and include other uses of the inventions and obvious modifications and equivalents thereof. Embodiments of the inventions are described with reference to the accompanying figures, wherein like numerals refer to like elements throughout. The terminology used in the description presented herein is not intended to be interpreted in any limited or restrictive manner simply because it is being used in conjunction with a detailed description of some specific embodiments of the inventions. In addition, embodiments of the inventions can comprise several novel features and no single feature is solely responsible for its desirable attributes or is essential to practicing the inventions herein described.

As feature sizes shrink, density increases, and more functionality is brought onto single semiconductor chips, there is an increasing need for efficient heat extraction. Liquid cooling has long been one option for cooling semiconductor chips. However, there are serious limitations to current technologies. For example, often, liquid cooling solutions are deployed relatively far from the chip itself. For example, a liquid cooling solution can be provided on top of a heat sink or heat spreader. It is possible to bring liquid cooling closer to the semiconductor chip itself, but there are significant complications.

Inadequate cooling of semiconductor devices can lead to decreased performance, increased errors, decreased lifespan, and so forth. Providing adequate cooling can be especially challenging for semiconductor devices made using advanced processing nodes, where features can be densely packed together, resulting in large heat production in a relatively small area. Accordingly, there is a need for improved cooling solutions.

According to some embodiments herein, heat transport away from a semiconductor chip can be improved via spraying liquid onto the backside of the chip. According to some embodiments, liquid flow can be facilitated using multiple spray nozzles (also referred to herein as spray jets), multiple channels, or both. In some embodiments, a plurality of spray jets can be provided. In some embodiments, the spray jets can be arranged in a regular pattern. In some embodiments, the spray jets may be unevenly distributed. For example, there can be an increased density of spray jets over areas of the semiconductor chip that are likely to produce the most heat.

In some embodiments, a cooling structure can comprise one or more layers. In some embodiments, each layer can be formed on a different substrate. In some embodiments, the substrates can be directly bonded to one another. In some embodiments, the channel structure can be directly bonded to a semiconductor chip. In some embodiments, wafer to wafer bonding can be used. In some embodiments, die to wafer bonding can be used. In some embodiments, die to die bonding can be used. In some embodiments, a combination of wafer to wafer, die to wafer, and/or die to die bonding can be used.

A channel structure can offer many advantages. If large, open chambers are used, structural integrity can be compromised. For example, if subjected to high pressures, cracking or breaking can occur, which can result in less efficient cooling or, in some cases, render a device inoperable. This issue can be mitigated to some extent by maintaining relatively low flow rates and pressures, but cooling ability can be limited as a result of the relatively slow flow and long time that liquid is contact with semiconductor chip. Channels can offer structural reinforcement, enabling higher pressure. In some embodiments, the layers defining the channels can be directly bonded to the semiconductor die without an adhesive. In addition to providing structural support, the channels can provide a degree of thermal isolation, which can reduce the transport of heat from one area of the semiconductor chip to another via the cooling liquid.

Figure 6:
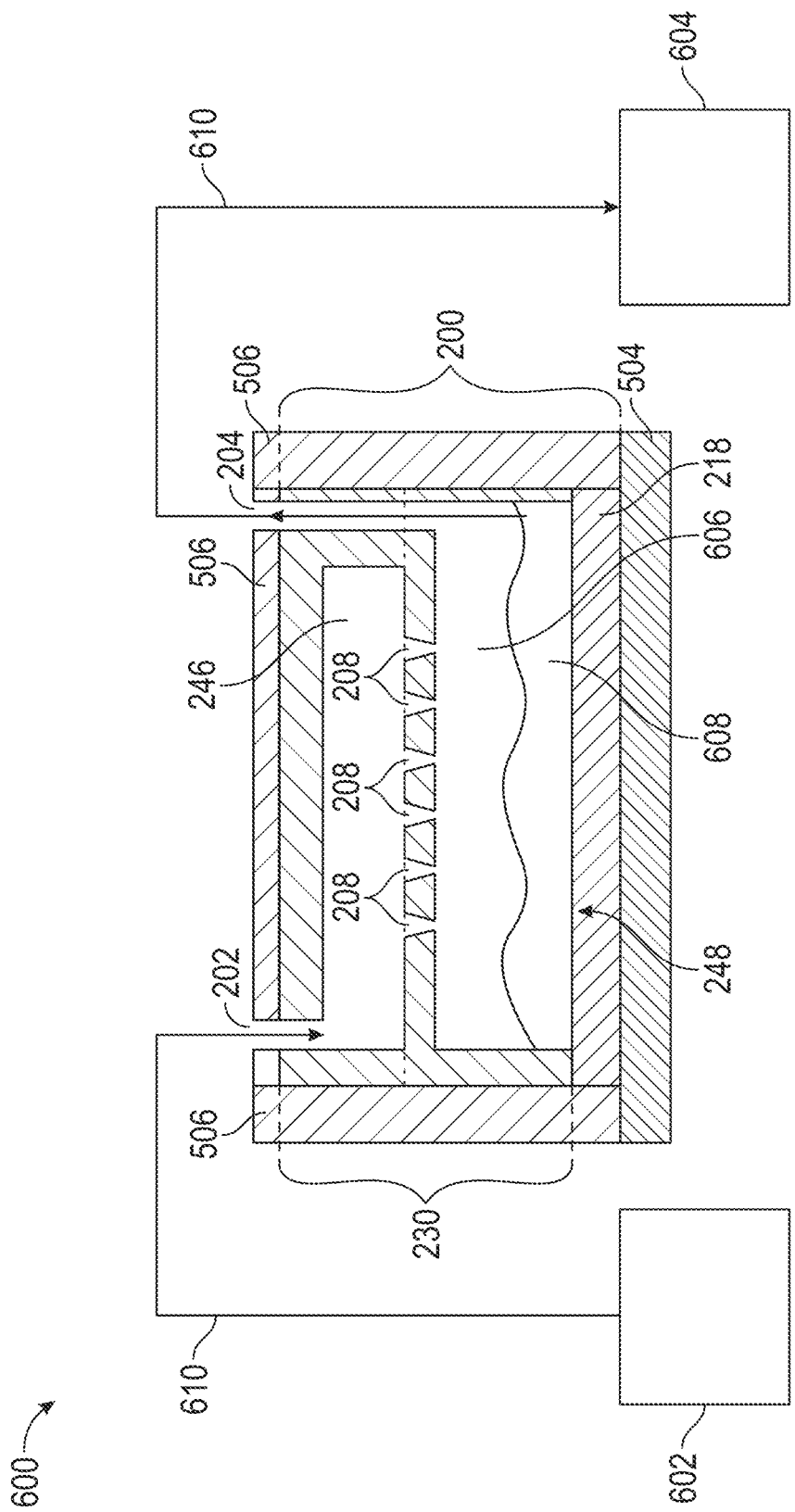
FIG. 6 is a schematic cross section illustrating an example embodiment of a package structure that is connected to an inlet pump and an outlet pump.

In some embodiments, a pump can be used to flow liquid into a cooling structure. In some embodiments, a pump can be used to remove liquid from the cooling structure. As shown in FIG. 6, described in more detail below, in some embodiments, using an extraction pump can cause a pressure differential that results in an air gap in the lower chamber. The formation of an air gap can improve performance. The nozzles can be tapered such that the pressure increases as the cooling liquid flows through the nozzles, resulting in a spray into the lower chamber. If the lower chamber is filled with liquid, the liquid can slow down the spray. If there is an air gap, the liquid can hit the semiconductor chip at a relatively high speed, which may increase cooling performance.

Various embodiments disclosed herein relate to directly bonded structures in which two or more elements can be directly bonded to one another without an intervening adhesive. Such processes and structures are referred to herein as "direct bonding" processes or "directly bonded" structures. Direct bonding can involve bonding of one material on one element and one material on the other element (also referred to as "uniform" direct bond herein), where the materials on the different elements need not be the same, without traditional adhesive materials. Direct bonding can also involve bonding of multiple materials on one element to multiple materials on the other element (e.g., hybrid bonding).

In some implementations (not illustrated), each bonding layer has one material. In these uniform direct bonding processes, only one material on each element is directly bonded. Example uniform direct bonding processes include the ZIBOND® techniques commercially available from Adeia of San Jose, CA. The materials of opposing bonding layers on the different elements can be the same or different, and may comprise elemental or compound materials. For example, in some embodiments, nonconductive bonding layers can be blanket deposited over the base substrate portions without being patterned with conductive features (e.g., without pads). In other embodiments, the bonding layers can be patterned on one or both elements, and can be the same or different from one another, but one material from each element is directly bonded without adhesive across surfaces of the elements (or across the surface of the smaller element if the elements are differently-sized). In another implementation of uniform direct bonding, one or both of the nonconductive bonding layers may include one or more conductive features, but the conductive features are not involved in the bonding. For example, in some implementations, opposing nonconductive bonding layers can be uniformly directly bonded to one another, and through substrate vias (TSVs) can be subsequently formed through one element after bonding to provide electrical communication to the other element.

In various embodiments, the bonding layers 108a and/or 108b can comprise a non-conductive material such as a dielectric material or an undoped semiconductor material, such as undoped silicon, which may include native oxide. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SiCOH dielectrics, silicon carbonitride or diamond-like carbon or a material comprising a diamond surface. Such carbon-containing ceramic materials can be considered inorganic, despite the inclusion of carbon. In some embodiments, the dielectric materials at the bonding surface do not comprise polymer materials, such as epoxy (e.g., epoxy adhesives, cured epoxies, or epoxy composites such as FR-4 materials), resin or molding materials.

In other embodiments, the bonding layers can comprise an electrically conductive material, such as a deposited conductive oxide material, e.g., indium tin oxide (ITO), as disclosed in U.S. Provisional Patent Application No. 63/524,564, filed Jun. 30, 2023, the entire contents of which is incorporated by reference herein in its entirety for providing examples of conductive bonding layers without shorting contacts through the interface.

In direct bonding, first and second elements can be directly bonded to one another without an adhesive, which is different from a deposition process and results in a structurally different interface compared to that produced by deposition. In one application, a width of the first element in the bonded structure is similar to a width of the second element. In some other embodiments, a width of the first element in the bonded structure is different from a width of the second element. The width or area of the larger element in the bonded structure may be at least 10% larger than the width or area of the smaller element. Further, the interface between directly bonded structures, unlike the interface beneath deposited layers, can include a defect region in which nanometer-scale voids (nanovoids) are present. The nanovoids may be formed due to activation of one or both of the bonding surfaces (e.g., exposure to a plasma, explained below).

The bond interface between non-conductive bonding surfaces can include a higher concentration of materials from the activation and/or last chemical treatment processes compared to the bulk of the bonding layers. For example, in embodiments that utilize a nitrogen plasma for activation, a nitrogen concentration peak can be formed at the bond interface. In some embodiments, the nitrogen concentration peak may be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen concentration peak can be formed at the bond interface between non-conductive bonding surfaces. In some embodiments, the bond interface can comprise silicon oxynitride, silicon oxycarbonitride, or silicon carbonitride. The direct bond can comprise a covalent bond, which is stronger than van Der Waals bonds. The bonding layers can also comprise polished surfaces that are planarized to a high degree of smoothness.

In direct bonding processes, such as uniform direct bonding and hybrid bonding, two elements are bonded together without an intervening adhesive. In non-direct bonding processes that utilize an adhesive, an intervening material is typically applied to one or both elements to effectuate a physical connection between the elements. For example, in some adhesive-based processes, a flowable adhesive (e.g., an organic adhesive, such as an epoxy), which can include conductive filler materials, can be applied to one or both elements and cured to form the physical (rather than chemical or covalent) connection between elements. Typical organic adhesives lack strong chemical or covalent bonds with either element. In such processes, the connections between the elements are weak and/or readily reversed, such as by reheating or defluxing.

By contrast, direct bonding processes join two elements by forming strong chemical bonds (e.g., covalent bonds) between opposing nonconductive materials. For example, in direct bonding processes between nonconductive materials, one or both nonconductive surfaces of the two elements are planarized and chemically prepared (e.g., activated and/or terminated) such that when the elements are brought into contact, strong chemical bonds (e.g., covalent bonds) are formed, which are stronger than Van der Waals or hydrogen bonds. In some implementations (e.g., between opposing dielectric surfaces, such as opposing silicon oxide surfaces), the chemical bonds can occur spontaneously at room temperature upon being brought into contact. In some implementations, the chemical bonds between opposing nonconductive materials can be strengthened after annealing the elements.

As noted above, hybrid bonding is a species of direct bonding in which both non-conductive features directly bond to non-conductive features, and conductive features directly bond to conductive features of the elements being bonded. The non-conductive bonding materials and interface can be as described above, while the conductive bond can be formed, for example, as a direct metal-to-metal connection. In conventional metal bonding processes, a fusible metal alloy (e.g., solder) can be provided between the conductors of two elements, heated to melt the alloy, and cooled to form the connection between the two elements. The resulting bond often evinces sharp interfaces with conductors from both elements, and is subject to reversal by reheating. By way of contrast, direct metal bonding as employed in hybrid bonding does not require melting or an intermediate fusible metal alloy, and can result in strong mechanical and electrical connections, often demonstrating interdiffusion of the bonded conductive features with grain growth across the bonding interface between the elements, even without the much higher temperatures and pressures of thermocompression bonding.

Figure 1B:
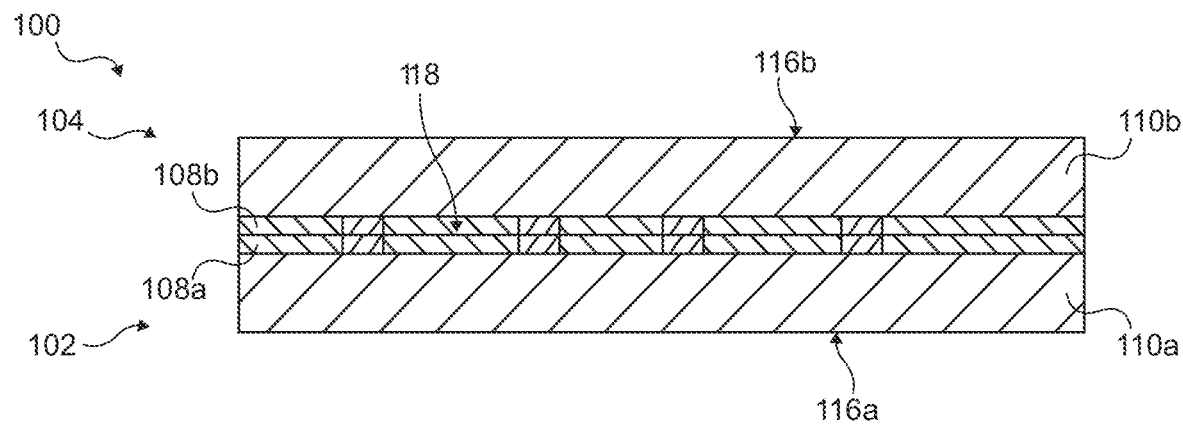

FIGS. 1A and 1B schematically illustrate cross-sectional side views of first and second elements 102, 104 prior to and after, respectively, a process for forming a directly bonded structure, and more particularly a hybrid bonded structure, according to some embodiments. In FIG. 1B, a bonded structure 100 comprises the first and second elements 102 and 104 that are directly bonded to one another at a bond interface 118 without an intervening adhesive. Conductive features 106a of a first element 102 may be electrically connected to corresponding conductive features 106b of a second element 104. In the illustrated hybrid bonded structure 100, the conductive features 106a are directly bonded to the corresponding conductive features 106b without intervening solder or conductive adhesive.

The conductive features 106a and 106b of the illustrated embodiment are embedded in, and can be considered part of, a first bonding layer 108a of the first element 102 and a second bonding layer 108b of the second element 104, respectively. Field regions of the bonding layers 108a, 108b extend between and partially or fully surround the conductive features 106a, 106b. The bonding layers 108a, 108b can comprise layers of non-conductive materials suitable for direct bonding, as described above, and the field regions are directly bonded to one another without an adhesive. The non-conductive bonding layers 108a, 108b can be disposed on respective front sides 114a, 114b of base substrate portions 110a, 110b.

The first and second elements 102, 104 can comprise microelectronic elements, such as semiconductor elements, including, for example, integrated device dies, wafers, passive devices, discrete active devices such as power switches, MEMS, etc. In some embodiments, the base substrate portion can comprise a device portion, such as a bulk semiconductor (e.g., silicon) portion of the elements 102, 104, and back-end-of-line (BEOL) interconnect layers over such semiconductor portions. The bonding layers 108a, 108b can be provided as part of such BEOL layers during device fabrication, as part of redistribution layers (RDL), or as specific bonding layers added to existing devices, with bond pads extending from underlying contacts. Active devices and/or circuitry can be patterned and/or otherwise disposed in or on the base substrate portions 110a, 110b, and can electrically communicate with at least some of the conductive features 106a, 106b. Active devices and/or circuitry can be disposed at or near the front sides 114a, 114b of the base substrate portions 110a, 110b, and/or at or near opposite backsides 116a, 116b of the base substrate portions 110a, 110b. In other embodiments, the base substrate portions 110a, 110b may not include active circuitry, but may instead comprise dummy substrates, passive interposers, passive optical elements (e.g., glass substrates, gratings, lenses), etc. The bonding layers 108a, 108b are shown as being provided on the front sides of the elements, but similar bonding layers can be additionally or alternatively provided on the back sides of the elements.

In some embodiments, the base substrate portions 110a, 110b can have significantly different coefficients of thermal expansion (CTEs), and bonding elements that include such different based substrate portions can form a heterogenous bonded structure. The CTE difference between the base substrate portions 110a and 110b, and particularly between bulk semiconductor (typically single crystal) portions of the base substrate portions 110a, 110b, can be greater than 5 ppm/° C. or greater than 10 ppm/° C. For example, the CTE difference between the base substrate portions 110a and 110b can be in a range of 5 ppm/° ° C. to 100 ppm/° C., 5 ppm/° ° C. to 40 ppm/° C., 10 ppm/° ° C. to 100 ppm/° C., or 10 ppm/° ° C. to 40 ppm/° C.

In some embodiments, one of the base substrate portions 110a, 110b can comprise optoelectronic single crystal materials, including perovskite materials, that are useful for optical piezoelectric or pyroelectric applications, and the other of the base substrate portions 110a, 110b comprises a more conventional substrate material. For example, one of the base substrate portions 110a, 110b comprises lithium tantalate (LiTaO3) or lithium niobate (LiNbO3), and the other one of the base substrate portions 110a, 110b comprises silicon (Si), quartz, fused silica glass, sapphire, or a glass. In other embodiments, one of the base substrate portions 110a, 110b comprises a III-V single semiconductor material, such as gallium arsenide (GaAs) or gallium nitride (GaN), and the other one of the base substrate portions 110a, 110b can comprise a non-III-V semiconductor material, such as silicon (Si), or can comprise other materials with similar CTE, such as quartz, fused silica glass, sapphire, or a glass. In still other embodiments, one of the base substrate portions 110a, 110b comprises a semiconductor material and the other of the base substrate portions 110a, 110b comprises a packaging material, such as a glass, organic or ceramic substrate.

In some arrangements, the first element 102 can comprise a singulated element, such as a singulated integrated device die. In other arrangements, the first element 102 can comprise a carrier or substrate (e.g., a semiconductor wafer) that includes a plurality (e.g., tens, hundreds, or more) of device regions that, when singulated, forms a plurality of integrated device dies, though in other embodiments such a carrier can be a package substrate or a passive or active interposer. Similarly, the second element 104 can comprise a singulated element, such as a singulated integrated device die. In other arrangements, the second element 104 can comprise a carrier or substrate (e.g., a semiconductor wafer). The embodiments disclosed herein can accordingly apply to wafer-to-wafer (W2W), die-to-die (D2D), or die-to-wafer (D2W) bonding processes. In W2W processes, two or more wafers can be directly bonded to one another (e.g., direct hybrid bonded) and singulated using a suitable singulation process. After singulation, side edges of the singulated structure (e.g., the side edges of the two bonded elements) can be substantially flush (substantially aligned x-y dimensions) and/or the edges of the bonding interfaces for both bonded and singulated elements can be coextensive, and may include markings indicative of the common singulation process for the bonded structure (e.g., saw markings if a saw singulation process is used).

While only two elements 102, 104 are shown, any suitable number of elements can be stacked in the bonded structure 100. For example, a third element (not shown) can be stacked on the second element 104, a fourth element (not shown) can be stacked on the third element, and so forth. In such implementations, through substrate vias (TSVs) can be formed to provide vertical electrical communication between and/or among the vertically-stacked elements. Additionally or alternatively, one or more additional elements (not shown) can be stacked laterally adjacent one another along the first element 102. In some embodiments, a laterally stacked additional element may be smaller than the second element. In some embodiments, the bonded structure can be encapsulated with an insulating material, such as an inorganic dielectric (e.g., silicon oxide, silicon nitride, silicon oxycarbonitride, etc.). One or more insulating layers can be provided over the bonded structure. For example, in some implementations, a first insulating layer can be conformally deposited over the bonded structure, and a second insulating layer (which may include be the same material as the first insulating layer, or a different material) can be provided over the first insulating layer.

To effectuate direct bonding between the bonding layers 108a, 108b, the bonding layers 108a, 108b can be prepared for direct bonding. Non-conductive bonding surfaces 112a, 112b at the upper or exterior surfaces of the bonding layers 108a, 108b can be prepared for direct bonding by polishing, for example, by chemical mechanical polishing (CMP). The roughness of the polished bonding surfaces 112a, 112b can be less than 30 Å rms. For example, the roughness of the bonding surfaces 112a and 112b can be in a range of about 0.1 Å rms to 15 Å rms, 0.5 Å rms to 10 Å rms, or 1 Å rms to 5 Å rms. Polishing can also be tuned to leave the conductive features 106a, 106b recessed relative to the field regions of the bonding layers 108a, 108b.

Preparation for direct bonding can also include cleaning and exposing one or both of the bonding surfaces 112a, 112b to a plasma and/or etchants to activate at least one of the surfaces 112a, 112b. In some embodiments, one or both of the surfaces 112a, 112b can be terminated with a species after activation or during activation (e.g., during the plasma and/or etch processes). Without being limited by theory, in some embodiments, the activation process can be performed to break chemical bonds at the bonding surface(s) 112a, 112b, and the termination process can provide additional chemical species at the bonding surface(s) 112a, 112b that alters the chemical bond and/or improves the bonding energy during direct bonding. In some embodiments, the activation and termination are provided in the same step, e.g., a plasma to activate and terminate the surface(s) 112a, 112b. In other embodiments, one or both of the bonding surfaces 112a, 112b can be terminated in a separate treatment to provide the additional species for direct bonding. In various embodiments, the terminating species can comprise nitrogen. For example, in some embodiments, the bonding surface(s) 112a, 112b can be exposed to a nitrogen-containing plasma. Other terminating species can be suitable for improving bonding energy, depending upon the materials of the bonding surfaces 112a, 112b. Further, in some embodiments, the bonding surface(s) 112a, 112b can be exposed to fluorine. For example, there may be one or multiple fluorine concentration peaks at or near a bond interface 118 between the first and second elements 102, 104. Typically, fluorine concentration peaks occur at interfaces between material layers. Additional examples of activation and/or termination treatments may be found in U.S. Pat. No. 9,391,143 at Col. 5, line 55 to Col. 7, line 3; Col. 8, line 52 to Col. 9, line 45; Col. 10, lines 24-36; Col. 11, lines 24-32, 42-47, 52-55, and 60-64; Col. 12, lines 3-14, 31-33, and 55-67; Col. 14, lines 38-40 and 44-50; and U.S. Pat. No. 10,434,749 at Col. 4, lines 41-50; Col. 5, lines 7-22, 39, 55-61; Col. 8, lines 25-31, 35-40, and 49-56; and Col. 12, lines 46-61, the activation and termination teachings of which are incorporated by reference herein.

Thus, in the directly bonded structure 100, the bond interface 118 between two non-conductive materials (e.g., the bonding layers 108a, 108b) can comprise a very smooth interface with higher nitrogen (or other terminating species) content and/or fluorine concentration peaks at the bond interface 118. In some embodiments, the nitrogen and/or fluorine concentration peaks may be detected using various types of inspection techniques, such as SIMS techniques. The polished bonding surfaces 112a and 112b can be slightly rougher (e.g., about 1 Å rms to 30 Å rms, 3 Å rms to 20 Å rms, or possibly rougher) after an activation process. In some embodiments, activation and/or termination can result in slightly smoother surfaces prior to bonding, such as where a plasma treatment preferentially erodes high points on the bonding surface.

The non-conductive bonding layers 108a and 108b can be directly bonded to one another without an adhesive. In some embodiments, the elements 102, 104 are brought together at room temperature, without the need for application of a voltage, and without the need for application of external pressure or force beyond that used to initiate contact between the two elements 102, 104. Contact alone can cause direct bonding between the non-conductive surfaces of the bonding layers 108a, 108b (e.g., covalent dielectric bonding). Subsequent annealing of the bonded structure 100 can cause the conductive features 106a, 106b to directly bond.

In some embodiments, prior to direct bonding, the conductive features 106a, 106b are recessed relative to the surrounding field regions, such that a total gap between opposing contacts after dielectric bonding and prior to anneal is less than 15 nm, or less than 10 nm. Because the recess depths for the conductive features 106a and 106b can vary across each element, due to process variation, the noted gap can represent a maximum or an average gap between corresponding conductive features 106a, 106b of two joined elements (prior to anneal). Upon annealing, the conductive features 106a and 106b can expand and contact one another to form a metal-to-metal direct bond.

During annealing, the conductive features 106a, 106b (e.g., metallic material) can expand while the direct bonds between surrounding non-conductive materials of the bonding layers 108a, 108b resist separation of the elements, such that the thermal expansion increases the internal contact pressure between the opposing conductive features. Annealing can also cause metallic grain growth across the bonding interface, such that grains from one element migrate across the bonding interface at least partially into the other element, and vice versa. Thus, in some hybrid bonding embodiments, opposing conductive materials are joined without heating above the conductive materials' melting temperature, such that bonds can form with lower anneal temperatures compared to soldering or thermocompression bonding.

In various embodiments, the conductive features 106a, 106b can comprise discrete pads, contacts, electrodes, or traces at least partially embedded in the non-conductive field regions of the bonding layers 108a, 108b. In some embodiments, the conductive features 106a, 106b can comprise exposed contact surfaces of TSVs (e.g., through silicon vias).

As noted above, in some embodiments, in the elements 102, 104 of FIG. 1A prior to direct bonding, portions of the respective conductive features 106a and 106b can be recessed below the non-conductive bonding surfaces 112a and 112b, for example, recessed by less than 30 nm, less than 20 nm, less than 15 nm, or less than 10 nm, for example, recessed in a range of 2 nm to 20 nm, or in a range of 4 nm to 10 nm. Due to process variation, both dielectric thickness and conductor recess depths can vary across an element. Accordingly, the above recess depth ranges may apply to individual conductive features 106a, 106b or to average depths of the recesses relative to local non-conductive field regions. Even for an individual conductive feature 106a, 106b, the vertical recess can vary across the feature, and so can be measured at or near the lateral middle or center of the cavity in which a given conductive feature 106a, 106b is formed, or can be measured at the sides of the cavity.

Beneficially, the use of hybrid bonding techniques (such as Direct Bond Interconnect, or DBI®, techniques commercially available from Adcia of San Jose, CA) can enable high density of connections between conductive features 106a, 106b across the direct bond interface 118 (e.g., small or fine pitches for regular arrays).

In some embodiments, a pitch p of the conductive features 106a, 106b, such as conductive traces embedded in the bonding surface of one of the bonded elements, may be less than 40 µm, less than 20 µm, less than 10 µm, less than 5 µm, less than 2 µm, or even less than 1 µm. For some applications, the ratio of the pitch of the conductive features 106a and 106b to one of the lateral dimensions (e.g., a diameter) of the bonding pad is less than 20, or less than 10, or less than 5, or less than 3 and sometimes desirably less than 2.

In various embodiments, the conductive features 106a and 106b and/or traces can comprise copper or copper alloys, although other metals may be suitable, such as nickel, aluminum, or alloys thereof. The conductive features disclosed herein, such as the conductive features 106a and 106b, can comprise fine-grain metal (e.g., a fine-grain copper). Further, a major lateral dimension (e.g., a pad diameter) can be small as well, e.g., in a range of about 0.25 µm to 30 µm, in a range of about 0.25 µm to 5 µm, or in a range of about 0.5 µm to 5 µm.

For hybrid bonded elements 102, 104, as shown, the orientations of one or more conductive features 106a, 106b from opposite elements can be opposite to one another. As is known in the art, conductive features in general can be formed with close to vertical sidewalls, particularly where directional reactive ion etching (RIE) defines the conductor sidewalls either directly though etching the conductive material or indirectly through etching surrounding insulators in damascene processes. However, some slight taper to the conductor sidewalls can be present, wherein the conductor becomes narrower farther away from the surface initially exposed to the etch. The taper can be even more pronounced when the conductive sidewall is defined directly or indirectly with isotropic wet or dry etching. In the illustrated embodiment, at least one conductive feature 106b in the bonding layer 108b (and/or at least one internal conductive feature, such as a BEOL feature) of the upper element 104 may be tapered or narrowed upwardly, away from the bonding surface 112b. By way of contrast, at least one conductive feature 106a in the bonding layer 108a (and/or at least one internal conductive feature, such as a BEOL feature) of the lower element 102 may be tapered or narrowed downwardly, away from the bonding surface 112a. Similarly, any bonding layers (not shown) on the backsides 116a, 116b of the elements 102, 104 may taper or narrow away from the backsides, with an opposite taper orientation relative to front side conductive features 106a, 106b of the same element.

As described above, in an anneal phase of hybrid bonding, the conductive features 106a, 106b can expand and contact one another to form a metal-to-metal direct bond. In some embodiments, the materials of the conductive features 106a, 106b of opposite elements 102, 104 can interdiffuse during the annealing process. In some embodiments, metal grains grow into each other across the bond interface 118. In some embodiments, the metal is or includes copper, which can have grains oriented along the 111 crystal plane for improved copper diffusion across the bond interface 118. In some embodiments, the conductive features 106a and 106b may include nanotwinned copper grain structure, which can aid in merging the conductive features during anneal. There is substantially no gap between the non-conductive bonding layers 108a and 108b at or near the bonded conductive features 106a and 106b. In some embodiments, a barrier layer may be provided under and/or laterally surrounding the conductive features 106a and 106b (e.g., which may include copper). In other embodiments, however, there may be no barrier layer under the conductive features 106a and 106b.

Figure 2A:
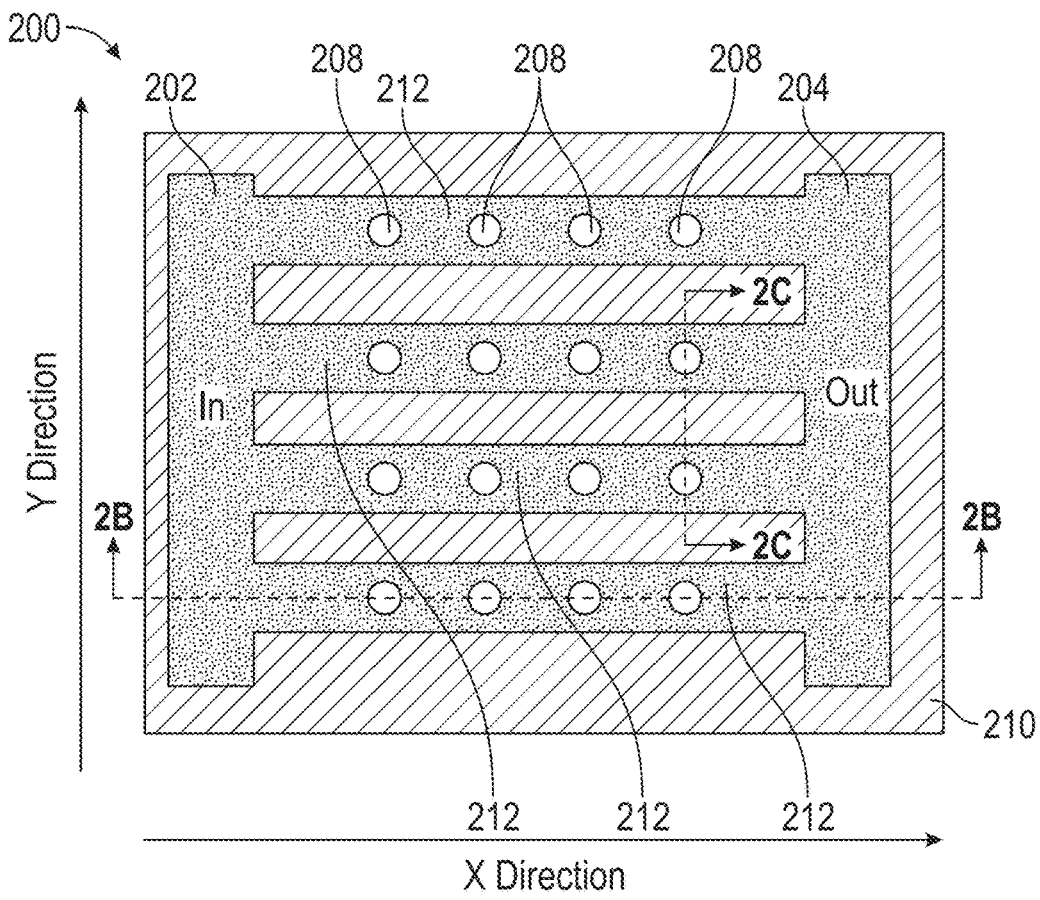
FIG. 2A is a schematic plan view showing channels in a liquid cooling structure.
Figure 2B:
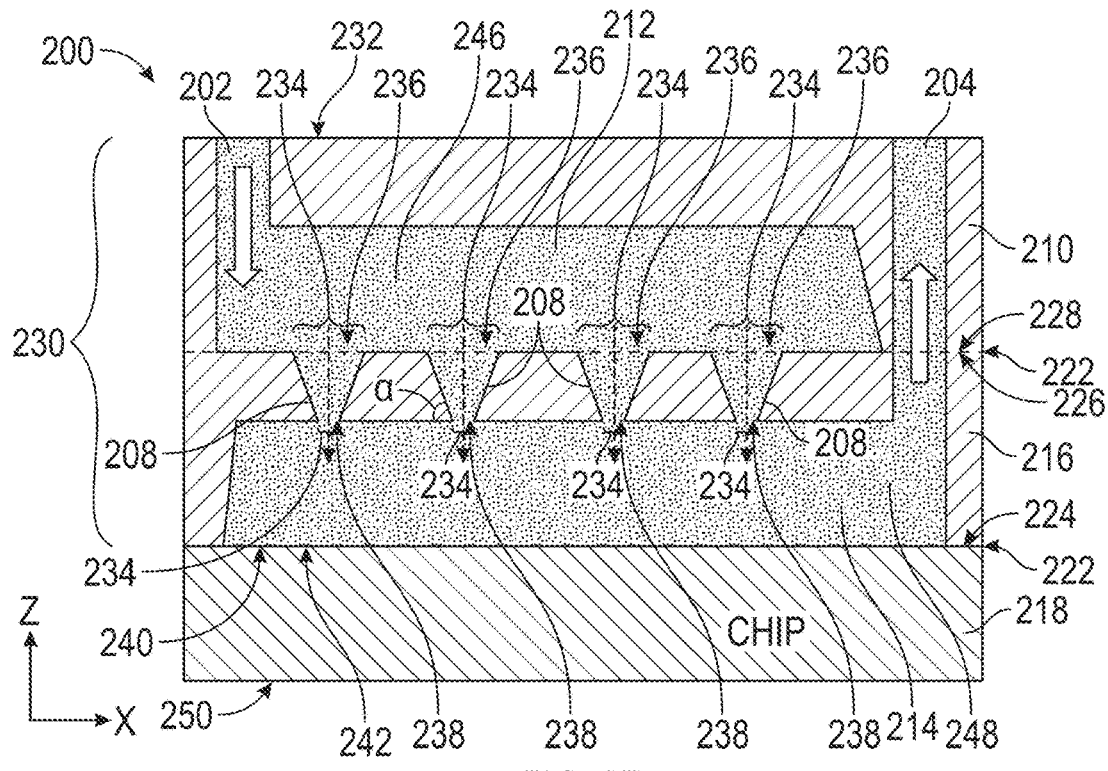
FIG. 2B is a schematic cross section taken along lines 2B-2B of FIG. 2A, along the length of parallel channels in upper and lower blocks of the cooling structure.
Figure 2C:
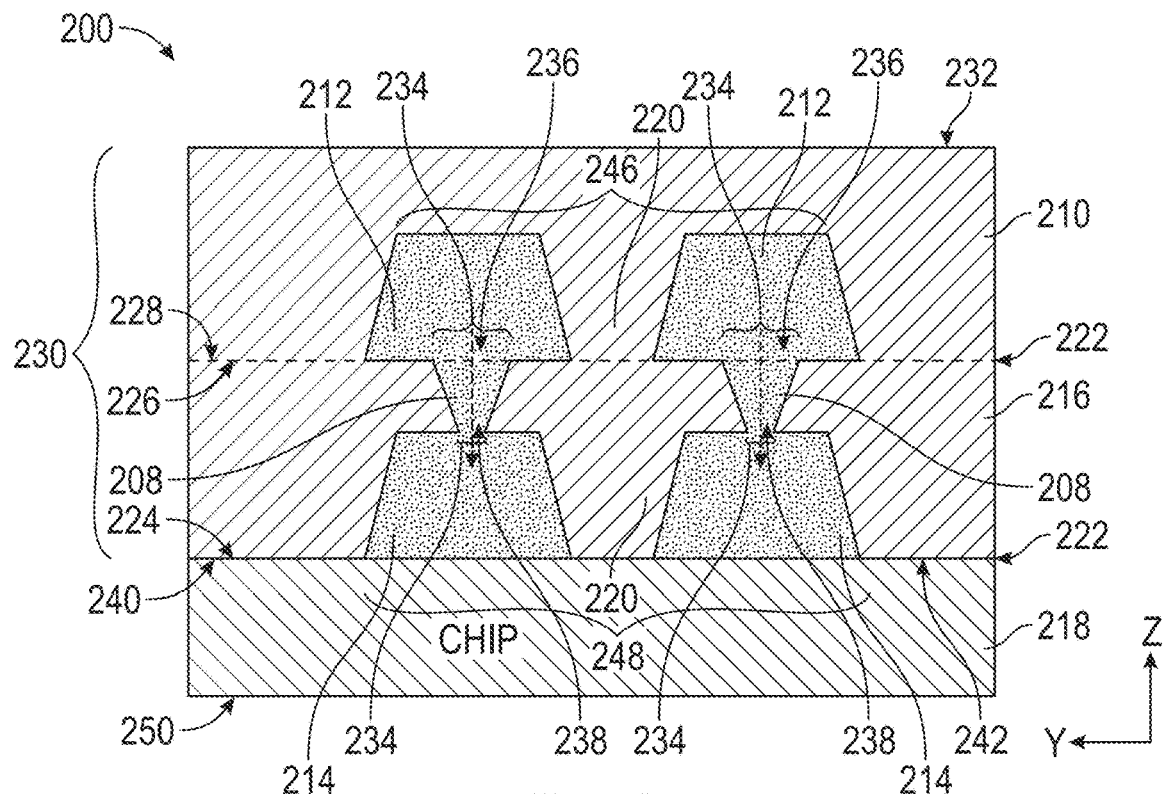
FIG. 2C is a schematic cross section taken along lines 2C-2C of FIG. 2A, across the width of two of the parallel channels in upper and lower blocks of the cooling structure.

FIGS. 2A-2C illustrate one embodiment for extracting heat with liquid cooling through the introduction of a cooling structure 230 on the back of integrated device die 218. In the descriptions of FIGS. 2A-6, for consistency and ease of description, orientations and surfaces are described such that the upper surfaces of features in the view of the cross-sections are treated as being on a first side, while lower surface of features in these views are treated as being on a second side.

FIG. 2A illustrates a top view of a bonded structure 200 while FIG. 2B shows a cross-sectional view of the bonded structure 200 comprising a cooling structure 230 attached to the integrated device die 218. The cooling structure 230 comprises an inlet 202, an outlet 204, two or more cavities 246, 248 corresponding to two or more elements 210, 216, and a plurality of nozzles 208. In the illustrated embodiment, the cavities 246, 248 each comprise a plurality of channels. In the illustrated plan view, a liquid (e.g., water, dielectric fluid, etc.) can enter the cooling structure 230 through the inlet 202 (e.g., "In"), propagate through a plurality of first channels 212, flow through the nozzles 208, flow through a plurality of second channels 214, and exit the cooling structure 230 through the outlet 204 (e.g., "Out"). The skilled artisan will appreciate from FIGS. 2B and 2C that FIG. 2A is merely schematic, and that the same channels do not lead directly from the inlet 202 to the outlet 204; rather the liquid is forced to flow from the first channels 212 through the nozzles 208, through the second channels 214.

FIGS. 2B-2C illustrate cross-sectional views in an xz-plane and a yz-plane, respectively, of the bonded structure 200. The illustrated bonded structure 200 comprises the cooling structure 230, having a first side 232 and a second side 242, bonded to the integrated device die 218, such as a chip or integrated circuit, through a bonding interface 222 between the cooling structure 230 and the integrated device die 218. In some embodiments, the cooling structure 230 is a semiconductor structure, comprising one or more semiconductor layers or blocks which can themselves be bonded together. In some embodiments, the cooling structure 230 comprises a material with a coefficient of thermal expansion (CTE) closely matching the CTE of the integrated device die 218 it is cooling.

In some embodiments, the cooling structure 230 is directly bonded to a back side 224 of the integrated device die 218 without an intervening adhesive. In other embodiments, the cooling structure 230 can be bonded to the front side 250 of the integrated device die 218. Direct bonding the cooling structure 230 to the back side 224 of the integrated device die 218 helps achieve a fluid-tight seal, while also ensuring excellent thermal contact in comparison with intervening adhesive layers. The cooling structure 230 comprises a first element 210 disposed over and bonded to a second element 216. In some embodiments, a second side 226 of the first element 210 (bottom side in the drawings) is directly bonded to a first side 228 (upper side in the drawings) of the second element 216 without an intervening adhesive. Directly bonding the first element 210 to the second element 216 comprises creating a fluid-tight seal between the two elements 210, 216 that make up the cooling structure 230, and also ensures excellent thermal contact. In some embodiments, the first element 210 has a coefficient of thermal expansion (CTE) that matches the CTE of the second element 216 of the cooling structure 230.

Although not illustrated, the skilled artisan will appreciate that directly bonded interfaces, such as the bonding interface 222 between the second side 242 of the cooling structure 230 and the back surface 224 of the integrated device die 218, and the bonding interface 222 between second side 226 of the first element 210 and the first side 228 of the second element 216, can be provided with bonding layers as described above. The direct bonding can be uniform direct bonding or can be hybrid bonding if metallic connections (not shown) are also desired for electrical or thermal reasons. The bonding layers can form part of the pre-bonding elements and provide the surfaces to be directly bonded, and each bonding layer can comprise an inorganic dielectric as described above. At least one of the bonding surfaces for each bonding interface can be prepared for direct bonding as described above.

Although one inlet 202 and one outlet 204 are shown, the cooling structure 230 can comprise multiple inlets and/or outlets.

In FIG. 2B the second element 216 comprises a second cavity 248 extending from the bonding interface 222. The second cavity 248 of the illustrated embodiment comprises multiple parallel channels 214, though the second cavity 248 can take other forms in other embodiments, such as non-parallel channels, an open chamber, etc. A plurality of nozzles 208 is disposed over and in fluid communication with the second cavity 248. Although four nozzles 208 are illustrated as coupled to the first cavity 246 in the view of FIG. 2B for one channel 214, some embodiments can include greater than four nozzles. In some embodiments, two or more nozzles 208 can be formed. Additionally, the nozzles 208 can be arranged in a periodic array. In some embodiments, the nozzles 208 can be configured to be in a non-periodic arrangement. The customization of the number and arrangement of nozzles 208 adds flexibility to the configurations that may be useful for cooling different types of chips or chips with hot spots. For example, in some embodiments, more nozzles 208 can be included over likely hot spots in integrated device die 218. When the second side 226 of the first element 210 is disposed on the first side 228 of the second element 216, the first cavity 246 is joined with the plurality of nozzles 208. The plurality of nozzles 208 (or spray nozzles) is configured to spray a cooling liquid at a direction perpendicular to the back side 224 of the die 218, and represent restrictions in the flow path from the inlet 202 to the integrated device die 218 being cooled. In some embodiments the liquid ejected through the plurality of nozzles 208 into the second cavity 248 can be collimated. In some embodiments, the liquid ejected through the plurality of nozzles 208 into the second cavity 248 can be tapered (e.g., pyramidical or conical). In some embodiments, the die 218 is exposed to the liquid (e.g., in some embodiments, the cooling liquid directly contacts or impinges upon the back side 224 of the die 218) for optimal thermal removal without the need for additional layers, such as a thermal interface layer.

As shown in FIG. 2C, the first cavity 246 comprises a first plurality of channels 212 in the first element 210 and the second cavity 248 comprises a second plurality of channels 214 in the second element 216. The cavities 246, 248 can also further comprise a plurality of support structures 220. While in the illustrated embodiment the support structures 220 also serve as walls between channels 212, 214 of the cavities 246, 248, in other embodiments the support structures can comprise pillars within cavities or channels. Support structures 220 included in the cavity 248 facing the integrated device die 218 provide structural support. The cavities may be subject to pressure during assembly, and in operation high pressure may be used to facilitate the vertical spraying of the liquid onto the integrated device die 218. The support structures 220 can help reduce the risk of cracking. In some embodiments the support structures 220 are directly bonded to the integrated device die or semiconductor element 218. The integrated device die 218 can be a semiconductor wafer at the time of assembly, to be later diced or singulated, or a semiconductor die. The first plurality of channels 212 is joined with the corresponding nozzles 208 in the second element 216 at the orifices 234 of the nozzles 208. In the illustrated embodiment, each orifice 234 is narrower than the corresponding cavity 246, 248. In some embodiments, the first element 210 includes the inlet 202, the outlet 204, and a first plurality of channels 212 in fluid communication with the plurality of nozzles 208, and the second element 216 includes the second plurality of channels 214 and the plurality of nozzles 208.

The first channels 212 are oriented parallel to the second channels 214 in the embodiment of FIGS. 2A-2C. In this parallel configuration, the inlet 202 is located opposite the outlet 204, as can be seen in the top view in FIG. 2A. As shown in FIG. 2B, a liquid (e.g., water, dielectric fluid, etc.) can enter and flow through the inlet 202 of the first element 210 of the cooling structure 230. The liquid can then flow into the first channels 212 in the first element 210, and then flow through the plurality of nozzles 208 on the first side 228 of the second element 216. In some embodiments, the liquid enters orifices 234 on the first sides 236 of the nozzles 208 and exits orifices 234 on the second sides 238 of the nozzles 208.

As noted, the nozzles 208 represent restrictions in the flow path and can represent greater than a 20% reduction in the flow path from first channels 212 to the nozzles 208, which increase flow rate through the nozzles, and enhances the cooling effect. In other words, a ratio of the flow path surface area in the first channels 212 to the flow path surface area in the nozzles 208 can be greater than 1.2:1, such as between 2:1 and 50:1.

In some embodiments, the nozzles 208 can have straight sidewalls. In the illustrated embodiment the orifices 234 on the first sides 236 of nozzles 208 are greater in size than the orifices 234 on the second sides 238 of nozzles 208. The orifices 234 on the second sides 238 of nozzles 208 comprise a narrow opening. In some embodiments, the orifices 234 can be rectangular or circular in shape from a top-down view. In some embodiments the orifices 234 can have dimensions of a width or a diameter between about 25 µm and about 50 µm. In some embodiments, the nozzles 208 can be formed comprising sides including an angle α, where a can be an angle at or between values of about 55° and about 90°. In some embodiments, there can be 10-80% reduction in the surface area of the orifices 234 from the first sides 236 of nozzles 208 to the second sides 238 of nozzles 208.

This narrow opening can create a high pressure, enhancing the cooling effect on the integrated device die 218. After exiting the nozzles 208, the liquid flows into the second channels 214 in the second element 216 of the cooling structure 230. The second channels 214 provide defined flow paths that can reduce or mitigate thermal crosstalk by providing a degree of thermal insulation, which reduces the transport of heat from one area of the die 218 to another via the cooling liquid and reduces risk of dead zones in the flow of coolant. As shown in FIG. 2B, the liquid flows into a second cavity 248 on the second side 240 of the second element 216 and then flows into outlet 204 and exits the cooling structure 230. In some embodiments, and as illustrated in FIG. 2B, the second side 240 is opposite the first side 228. The apparatus readily facilitates moving a liquid through the cooling structure to bring it in contact with a surface to be cooled through the pressure drop between the inlet 202 and the outlet 204. Although the embodiment of FIG. 2B shows the first element 210 comprising the inlet 202, the outlet 204, and a first cavity 246 while the nozzles are provided in the second element 216, in other embodiments, the first element can instead include the nozzles. In still other embodiments, the inlet and outlet need not be formed at the first side of the first element, for example the inlet can be provided in the first element and outlet in the second element, and the inlet and/or outlet can be horizontally oriented at the edges of the cooling structure.

FIG. 2C shows that in some embodiments the widths of the nozzles 208 can be smaller in size as compared to the widths of the channels 212, 214. Additionally, while the orifices 234 of the nozzles 208 are shown in FIG. 2A as circular, the shape of the orifices 234 of the nozzles 208 need not be circular and can be configured to have other geometrical shapes (e.g., square). In fact, as discussed in more detail below, tapered nozzles formed by wet etching of single crystal silicon may naturally be rectangular in a top-down view, and pyramidical in three-dimensional shape.

Figure 3A:
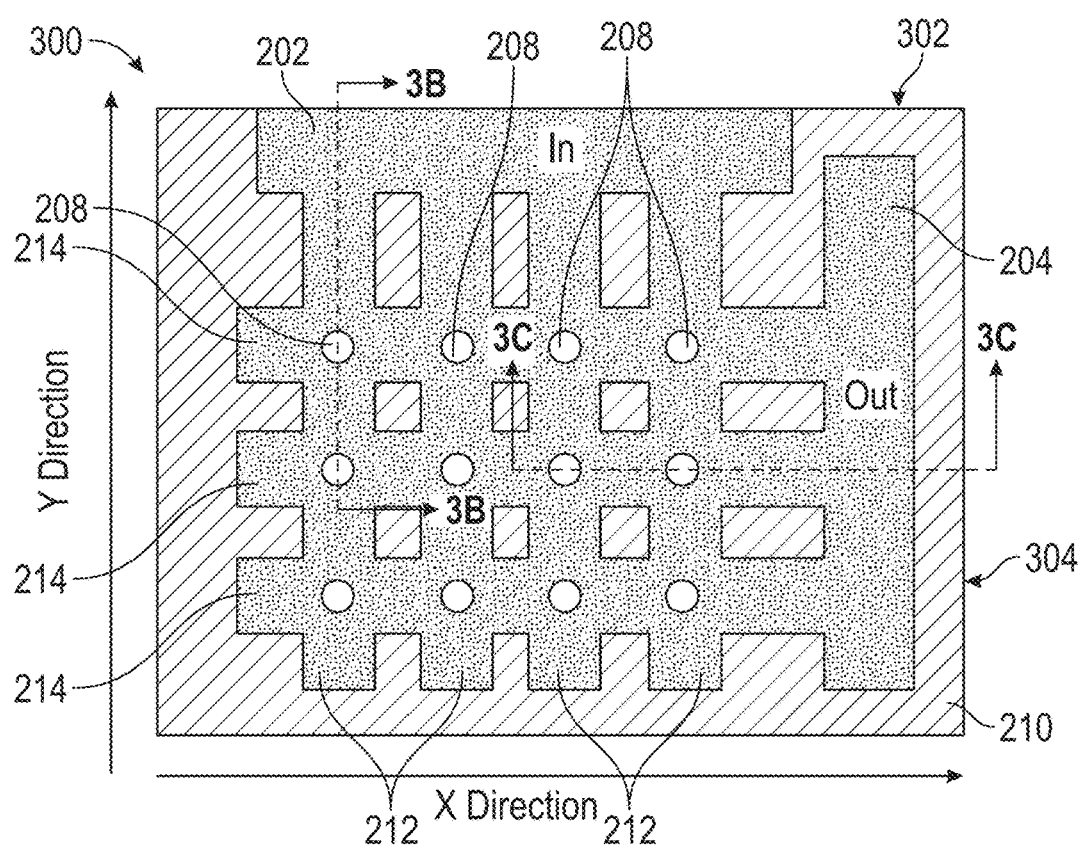
FIG. 3A is a schematic plan view showing horizontal positions of intersecting non-parallel channels in a cooling structure, according to another embodiment.
Figure 3B:
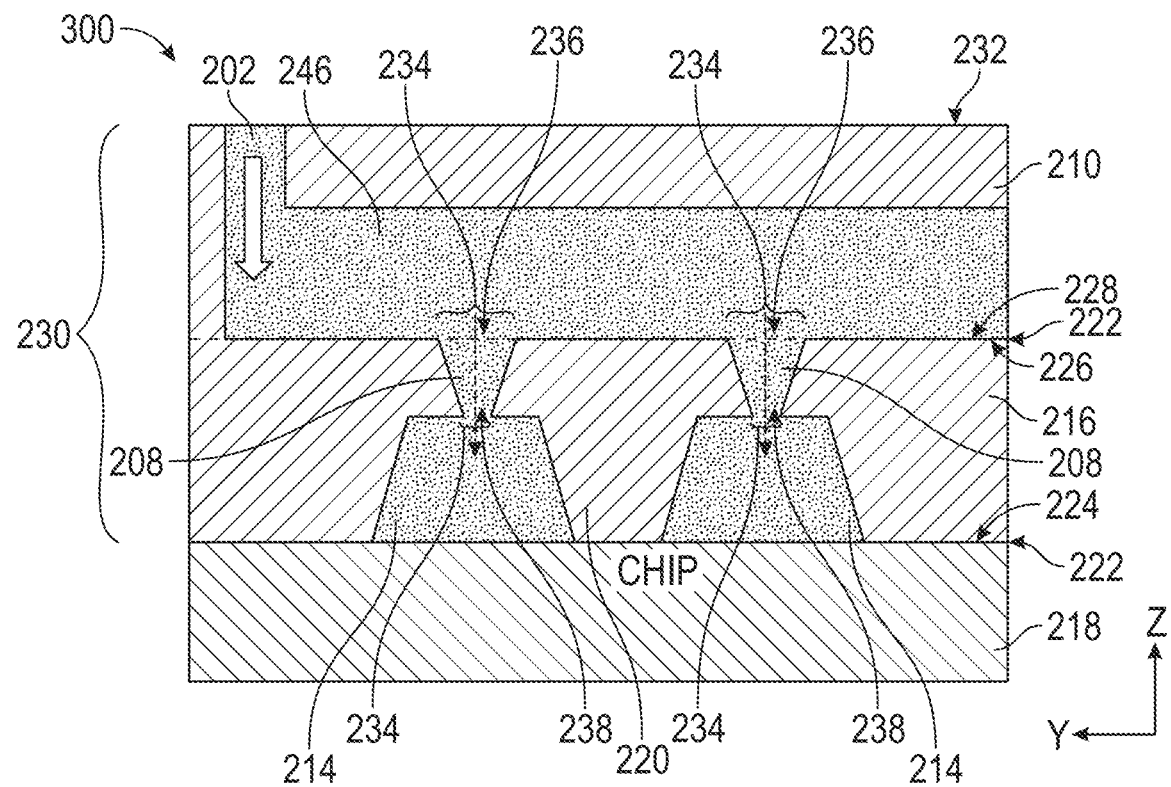
FIG. 3B is a schematic cross section taken along lines 3B-3B of FIG. 3A, along a length of one channel of an upper block of the cooling structure and across the width of two channels of a lower block.
Figure 3C:
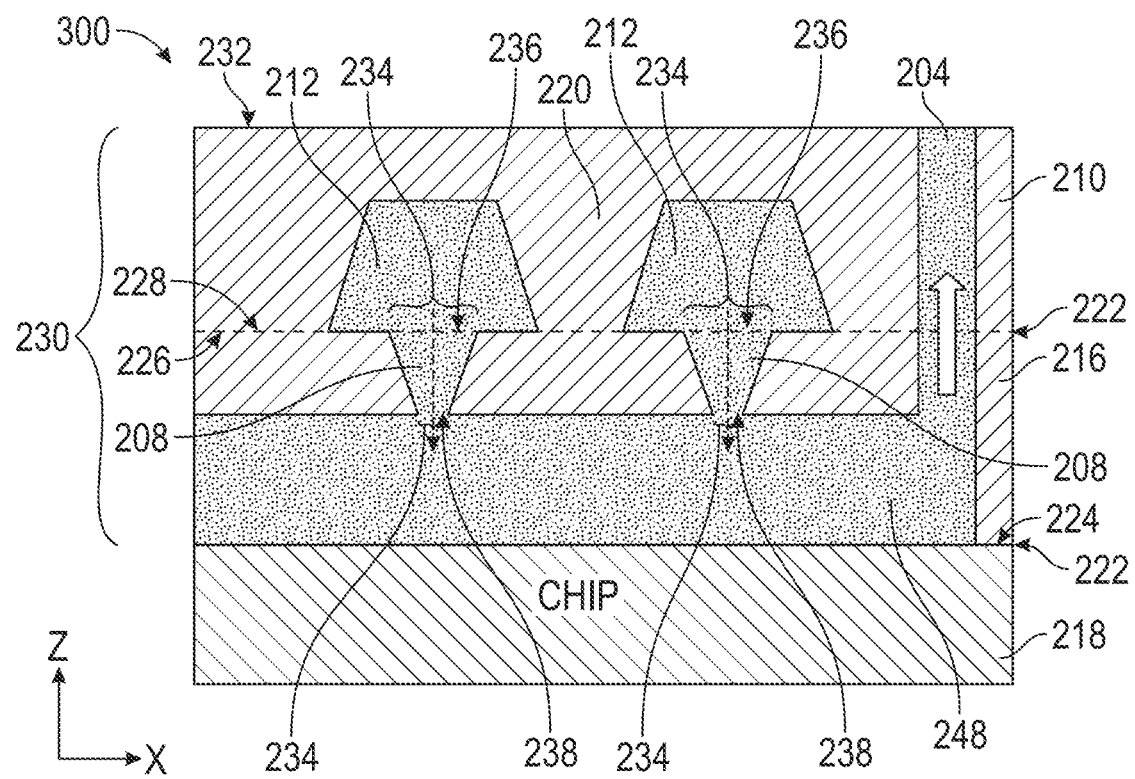
FIG. 3C is a schematic cross section taking along lines 3C-3C of FIG. 3A, along a length of one channel of the lower block and across the width of two channels of the upper block.

FIGS. 3A through 3C illustrate a bonded structure 300, according to another embodiment. Unless otherwise noted, the components of FIGS. 3A-3C are the same as or generally similar to like-numbered components of FIGS. 2A-2C. Unlike in FIGS. 2A-2C, in which the first channels 212 in the first cavity 246 of the first element 210 are configured to be parallel to the second channels 214 in the second cavity 248 of the second element 216, in the embodiment of FIGS. 3A-3C, the first channels 212 are configured to be perpendicular to the second channels 214. The inlet 202 and outlet 204 communicate with lateral channels that are non-parallel to each other. For example, as shown in the plan view of FIG. 3A, the inlet 202 is disposed at a first lateral side 302 and outlet 204 is disposed at a second lateral side 304 such that the first side 302 is perpendicular to second side 304. In this configuration, the inlet 202 can be viewed in a yz-plane cross-section of the bonded structure 300 in FIG. 3B, and the outlet 204 can be viewed in an xz-plane cross-section of the bonded structure 300 in FIG. 3C. In some embodiments, the first channels 212 are configured to be non-parallel to the second channels 214. A non-parallel configuration allows for customizability and flexibility in the manufacture of a cooling structure that fits the needs of a given cooling application.

Figure 4A:
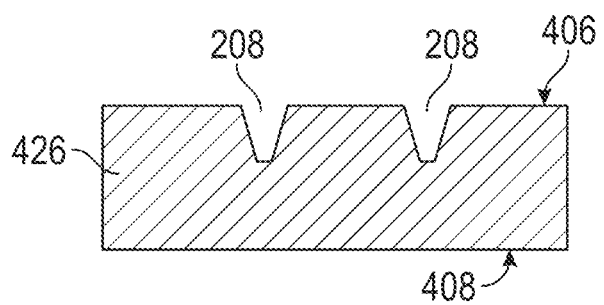
FIGS. 4A-4E are schematic cross sections illustrating an example process for forming a cooling structure according to some embodiments.

FIGS. 4A-4E illustrate a fabrication process for forming a cooling structure 400, similar to the cooling structures 230 of FIGS. 2A-3C. A second substrate 426 is shown in FIG. 4A. In FIG. 4A, a plurality of nozzles 208 can be formed or etched (e.g., wet or dry etching) in the second substrate 426 on a first side 406 of the second substrate 426. In one embodiment, the second substrate 426 can comprise a crystalline structure, such as a single crystal semiconductor (e.g., silicon) substrate or wafer. As is known in the art, masking and etching such a substrate, for example with a potassium hydroxide (KOH) or tetramethyl ammonium hydroxide (TMAH) dip or vapor, can naturally result in the illustrated sloped via to serve as the nozzles 208, due to the longer exposure to the etchant at the first side 406, and/or due to preferential etching along crystalline orientations. Such anisotropic etching along crystalline structures can also naturally result in rectangular-shaped openings, or pyramidical shapes in three dimensions, even if the mask opening was round. Although the nozzles 208 are shown to be formed with tapered sides, in some embodiments, the nozzles can be formed with straight sides, using techniques such as dry etching (e.g., reactive ion etching (RIE)).

Figure 4B:
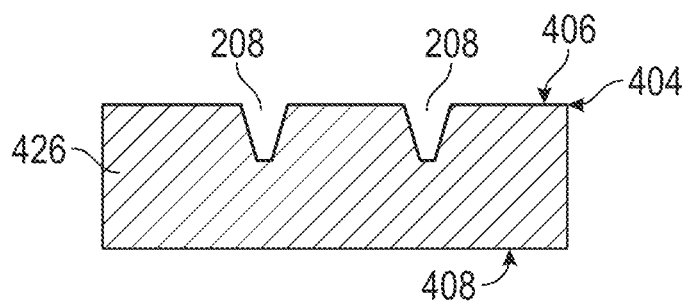
Figure 4C:
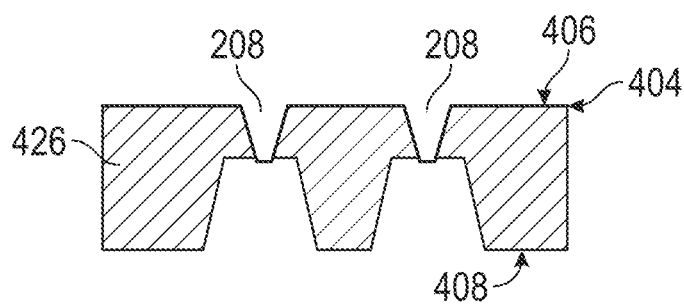

A protective layer 404 can be formed or deposited on the first side 406 of the second substrate 426 and as shown in FIG. 4B. The protective layer 404 can be formed of a material that resists subsequent etching (FIG. 4C). For example, for wet etching a silicon substrate with KOH or TMAH, the protective layer 404 can comprise silicon oxide or silicon nitride, which resist such etchants and are etched much more slowly (e.g., >100:1 selectivity) compared to silicon.

FIG. 4C illustrates forming or etching (e.g., wet or drying etching) the second cavity 248, which can include the second channels 214, on a second side 408 of the second substrate 426 opposite the first side 406 of the second substrate 426. For example, for a silicon substrate, the etch can comprise a KOH or TMAH dip, as noted above with respect to etching the nozzles 208. The protective layer 404 can prevent etching of the first side 406 when the channels 214 are being formed. The channels 214 are aligned with the nozzles 208. The channels 214 are also shown as sloped due to the selection of type of etch, but as with the nozzles 208, the walls can be made more vertical by use, for example, of RIE.

Figure 4D:
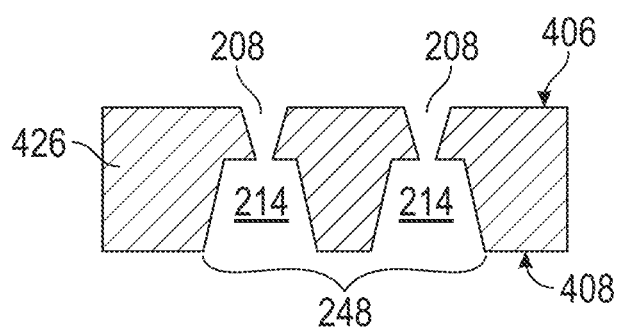

In FIG. 4D, the protective layer 404 is removed (i.e., removed by selective wet or dry etching, etc.).

Figure 4E:
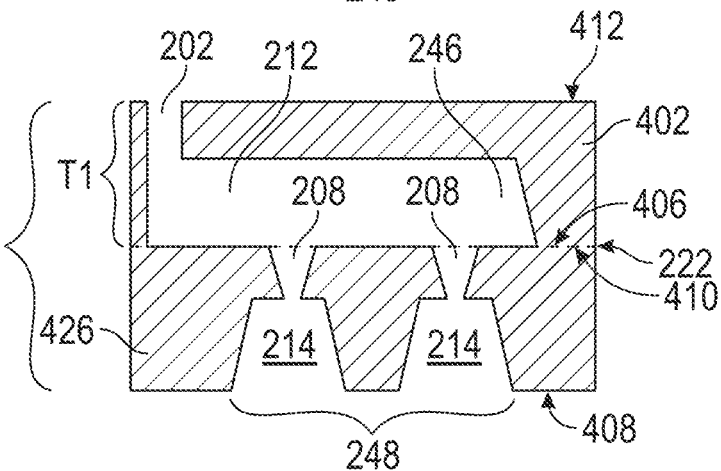

The first cavity 246, which can include the first channels 212 as described with respect to FIGS. 2A-3C, can be formed or etched (e.g., wet or dry etching) on a second side 410 of a first substrate 402, as shown in FIG. 4E. FIG. 4E further comprises forming or etching (e.g., wet or dry etching) the inlet 202 and the outlet 204 (not shown in FIG. 4E) on a first side 412 of the first substrate 402. Etching on both sides of the first substrate 402 can employ a protective layer as described above, which can be omitted particularly if reactive ion etching (RIE) is employed for the second etch in place of wet etching where vertical walls are desired, such as for the inlet and outlet.

FIG. 4E also illustrates bonding the first side 406 of the second substrate 426 to the second side 410 of the first substrate 402. In some embodiments, the outlet 204 extends from the first side 412 of the first substrate 402 through the second side 406 of the first substrate 402, and the inlet 202 extends from the first side 412 of the first substrate 402 to a depth less than a thickness T1 of the first substrate 402. After bonding, the channels 214 of the second substrate 426 can be directly connected to the outlet 204. In some embodiments, the fabrication process comprises directly bonding the first side 406 of the second substrate 426 to the second side 410 of the first substrate 402. In some embodiments, this direct bonding can be done without an intervening adhesive. In some embodiments the direct bonding comprises forming an inorganic dielectric bonding layer, such as silicon oxide, on the first side 406 of the second substrate 426 and/or on the second side 410 of the first substrate 402. The first and second substrates 402, 426 can comprise a semiconductor material with inorganic bonding layers at direct bonding surfaces. Additionally, the formation of the first cavity 246 (e.g., first channels 212), second cavity 248 (e.g., second channels 214), and nozzles 208 can be entirely accomplished through wet etching processes, which allows for relatively inexpensive batch processing of the cooling structure 400, and can result in the sloped sidewalls illustrated due to preferential etching along crystallographic facets.

Although the cooling structure 400 has been described to be formed through a method utilizing two substrates 402, 426, in some embodiments, three substrates could be used. For example, the method of forming the cooling structure could comprise three layers such that a first plurality of channels is formed in a first substrate (first layer), a plurality of nozzles is formed in a second substrate (second layer), and a second plurality of channels is formed in a third substrate (third layer). The first layer can be direct bonded to the second layer, and the second layer can be direct bonded to the third layer. In this latter method of formation, the concern of etching an unintended side is removed or mitigated by further separating the layers into which the channels and nozzles are etched into, but an additional substrate, additional alignment process and additional bonding process are entailed.

The fabrication process for forming a cooling structure 400 can further comprise the steps of bonding the cooling structure 400 to the integrated device die 218, either at the wafer or die stage. For example, the second side 408 of the second substrate 426 of the cooling structure 400 can be bonded to a semiconductor element that is or includes the integrated device die 218. The second channels 214 of the second substrate 426 are exposed to the semiconductor element 218. In some embodiments, bonding the cooling structure 400 to the integrated device die 218 can comprise directly bonding the second side 408 of the second substrate 426 to the integrated device die 218 or the wafer from which it will be singulated. In some embodiments, the second substrate 426 and the first substrate 402 can have a coefficient of thermal expansion that is matched to a coefficient of thermal expansion of the integrated device die 218.

Figure 5:
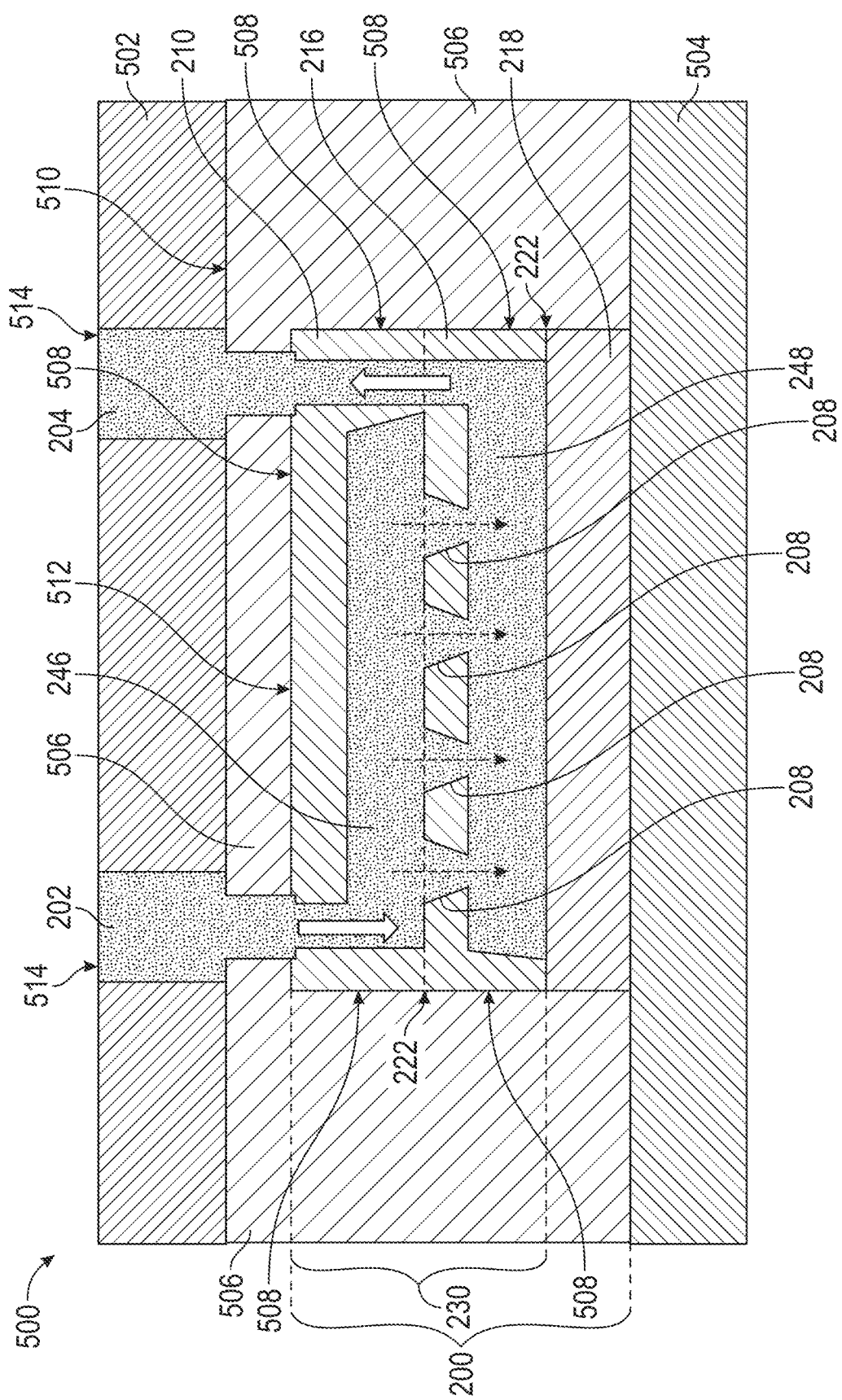
FIG. 5 is a schematic cross section illustrating an example embodiment of a package structure.

FIG. 5 illustrates one embodiment of a semiconductor device package 500 comprising the cooling structure 230. In the semiconductor device package 500, the bonded structure 200 comprises the cooling structure 230 including a first cavity 246 over the second cavity 248 with intervening nozzles 208 communicating fluid between the two, and the cooling structure 230 is direct bonded to the integrated device die 218. The bonded structure 200 is embedded in an encapsulant 506. The encapsulant 506 envelopes at least outer side surfaces 508 of the first element 210 and the second element 216 of the cooling structure 230. The encapsulant 506 provides protection to the integrated device die 218 and the cooling structure 230 from the environment (e.g., protection from external heat). In some embodiments the encapsulant 506 can be formed through a molding method and formed using conventional epoxy or other polymer molding materials. A heat sink or heat spreader 502 is disposed on a top surface 510 of the encapsulant 506 and affixed to the encapsulant 506 in which the bonded structure 200 is embedded. The heat sink/spreader 502 further aids in the dissipation of heat generated in the semiconductor device package 500. The top surface 510 of the encapsulant 506 can be disposed on a side 512 of the first element 210 opposite the semiconductor element 218. The heat sink/spreader 502, encapsulant 506, and bonded structure 200 are disposed over a package substrate 504 as shown in FIG. 5. In some embodiments, the heat sink/spreader 502 can comprise metal. In some embodiments, the heat sink/spreader can include ports or connections 514. In some embodiments, the presence of ports or connections 514 allows for connection of the semiconductor device package 500 to coolant lines 610 (shown in FIG. 6). Such coolant lines could be configured to facilitate the pumping in of cooling liquid and pumping out of heated liquid (i.e., liquid heated through the exchange of heat between the integrated device die 218 and the cooling liquid sprayed into the second cavity 246), thereby facilitating efficient heat dissipation from the integrated device die 218.

FIG. 6 illustrates one embodiment of a semiconductor device package 600 comprising the bonded structure 230 and inlet and outlet pumps 602, 604. Unless otherwise noted, the components of FIG. 6 can be the same as or generally similar to the like-numbered components of FIG. 5. In FIG. 6, an inlet pump 602 can be used to flow a liquid (e.g., coolant) into the cavity 246 and an outlet pump 604 can be used to remove the liquid from the cavity 248. Although the embodiment of FIG. 6 does not illustrate a heat sink/spreader 502, and instead shows the encapsulant 506 extending over the cooling structure 230, in some embodiments a heat sink/spreader 502 can be included and the connections 514 (shown in FIG. 5) can be used with the coolant lines or pipes 610. In some embodiments, the outlet pump 604 can be used to create an air gap or pocket 606 in the second cavity 248 (e.g., second channels 214) facing the integrated device die 218. The outlet pump 604 can be configured to reduce the pressure near the outlet 204 such that this pressure is less than the pressure in the second cavity 248 facing the integrated device die 218.

Producing an air gap 606 can increase the efficiency of the spray jet and improve thermal removal. In the embodiment of FIG. 6, the semiconductor device package 600 can be configured to create negative pressure on the outlet 204 to increase the pressure drop in the system between the inlet 202 and the outlet 204. In creating the air gap 606, the cooling liquid can be ejected from the nozzles 208 as a vapor in air within the bottom cavity 248. The vapor can then form a layer of liquid 608 in the bottom cavity 248, which can then be pumped out through the outlet 204. Ejection of the liquid into the air gap 606 can improve the dispersion of the cooling liquid as it exits the nozzles 208 as a vapor or spray (e.g., conical), instead of a jet (e.g., collimated). Further, the inclusion of the air gap 606 can help maintain a high velocity near the surface to be cooled, which allows for an improved thermal removal process. In some embodiments, the cooling liquid can be ejected from the nozzles 208 into a liquid-filled cavity 248. In some embodiments, the cooling liquid can be ejected from the nozzles 208 into a cavity 248 comprising a vacuum. In some embodiments, the spraying of the cooling liquid can be continuous. In some embodiments, the spraying of the cooling liquid can be non-continuous or pulsed. In some embodiments, the non-continuous or pulsed spraying of the cooling liquid can facilitate the creation of an air gap for evaporative cooling. In some embodiments, the inclusion of nozzles with tapered sidewalls can reduce turbulence, leading to less resistance to flow and velocity. Thus, in such embodiments, non-continuous or pulsed spraying of the cooling liquid can introduce turbulence and aid in eliminating dead spots, improving heat transfer of the heat generated by the integrated device die to the cooling liquid. For example, the pulsed spraying can have a duty cycle of at least 50%, such as a duty cycle of about 55% to about 90%.

In one aspect, the techniques described herein relate to a method of forming a cooling structure having a first side and a second side opposite the first side, the method including: forming an inlet and an outlet in a first substrate; forming at least one channel on the second side of the first substrate, wherein the at least one channel is in fluid communication with the inlet and the outlet; forming a plurality of nozzles on the first side of a second substrate; forming a plurality of channels on the second side of the second substrate opposite the first side of the second substrate, wherein the plurality of channels is aligned with the nozzles; and bonding the second side of the first substrate to the first side of the second substrate.

In some embodiments, the techniques described herein relate to a method, wherein the outlet extends from the first side of the first substrate through the second side of the first substrate, and wherein the inlet extends from the first side of the first substrate to a depth less than a thickness of the first substrate.

In some embodiments, the techniques described herein relate to a method, wherein the plurality of channels of the second substrate is directly connected to the outlet.

In some embodiments, the techniques described herein relate to a method, further including forming an inorganic dielectric layer on the second side of the second substrate.

In some embodiments, the techniques described herein relate to a method, wherein bonding the second side of the first substrate to the first side of the second substrate includes directly bonding the second side of the first substrate to the first side of the second substrate without an intervening adhesive.

In some embodiments, the techniques described herein relate to a method of forming a liquid-cooled package, the method including: the method of forming a cooling structure and bonding the second side of the second substrate to a semiconductor element.

In some embodiments, the techniques described herein relate to a method, wherein the plurality of channels of the second substrate is exposed to the semiconductor element.

In some embodiments, the techniques described herein relate to a method, wherein bonding the second side of the second substrate to the semiconductor element includes directly bonding the second side of the second substrate to the semiconductor element without an intervening adhesive.

In some embodiments, the techniques described herein relate to a method, wherein the semiconductor element includes one of a wafer or a semiconductor die.

In some embodiments, the techniques described herein relate to a method, wherein the first substrate and the second substrate have a coefficient of thermal expansion that is matched to a coefficient of thermal expansion of the semiconductor element.

In some embodiments, the techniques described herein relate to a method, wherein directly bonding includes forming an oxide bonding layer on the second side of the first substrate or on the first side of the second substrate.

In some embodiments, the techniques described herein relate to a method, wherein forming the plurality of nozzles includes forming tapered openings.

In some embodiments, the techniques described herein relate to a method, wherein forming tapered openings includes wet etching a single crystal material of the second substrate.

In some embodiments, the techniques described herein relate to a method, wherein the tapered openings are rectangular in shape.

In another aspect, the techniques described herein relate to a cooling structure including: a semiconductor structure having a bonding surface for bonding to an integrated device die and a back surface opposite the bonding surface, the semiconductor structure including: a plurality of cavities extending into the semiconductor structure from the bonding surface; and a plurality of nozzles, each nozzle of the plurality of nozzles disposed over and in fluid communication with a corresponding cavity of the plurality of cavities.

In some embodiments, the techniques described herein relate to a cooling structure, wherein each nozzle of the plurality of nozzles joins with the corresponding cavity at an orifice, the orifice narrower than the corresponding cavity.

In some embodiments, the techniques described herein relate to a cooling structure, wherein the semiconductor structure includes a first element and a second element directly bonded to the first element without an intervening adhesive.

In some embodiments, the techniques described herein relate to a cooling structure, wherein the first element includes an inlet, an outlet, and a first plurality of channels in fluid communication with the plurality of nozzles, and wherein the second element includes a second plurality of channels and the plurality of nozzles.

In some embodiments, the techniques described herein relate to a cooling structure, wherein the plurality of nozzles is tapered to have wider openings on a first side and narrower openings on a second side, wherein the narrower openings are in fluid communication with the plurality of cavities.

In some embodiments, the techniques described herein relate to a bonded structure including the cooling structure and the integrated device die, the cooling structure directly bonded to a back side of the integrated device die without an intervening adhesive.

In another aspect, the techniques described herein relate to a cooling structure including: an inlet; a first element; a second element; and an outlet, wherein the first element includes the inlet and a first cavity, wherein the second element includes a plurality of nozzles on a first side and a second cavity on a second side opposite the first side, wherein a bottom surface of the first element is disposed on a top surface of the second element, wherein the cooling structure is configured to allow a liquid to flow from the inlet into the first cavity, from the first cavity into the plurality of nozzles, from the plurality of nozzles into the second cavity, and from the second cavity to the outlet.

In some embodiments, the techniques described herein relate to a cooling structure, wherein the first cavity includes a first plurality of channels and at least one support structure, wherein the second cavity includes a second plurality of channels and at least one support structure.

In some embodiments, the techniques described herein relate to a cooling structure, wherein the first plurality of channels is parallel to the second plurality of channels.

In some embodiments, the techniques described herein relate to a cooling structure, wherein the first plurality of channels is perpendicular to the second plurality of channels.

In some embodiments, the techniques described herein relate to a cooling structure, wherein the plurality of nozzles is exposed to the first cavity on a first side of the plurality of nozzles and to the second cavity on a second side of the plurality of nozzles, wherein the first side of the plurality of nozzles has an opening size that is greater than an opening size of the second side of the plurality of nozzles.

In some embodiments, the techniques described herein relate to a cooling structure, wherein the plurality of nozzles includes one or more sidewalls formed with wet etching.

In some embodiments, the techniques described herein relate to a cooling structure, wherein the plurality of nozzles includes a plurality of circular openings.

In some embodiments, the techniques described herein relate to a cooling structure, wherein the plurality of nozzles includes a plurality of rectangular openings.

In some embodiments, the techniques described herein relate to a cooling structure, wherein the bottom surface of the first element is directly bonded to the top surface of the second element.

In some embodiments, the techniques described herein relate to a cooling structure, wherein the cooling structure is directly bonded to a semiconductor element.

In some embodiments, the techniques described herein relate to a cooling structure, wherein the least one support structure of the second element is directly bonded to the semiconductor element.

In some embodiments, the techniques described herein relate to a cooling structure, wherein an exposed outer surface of the first element and the second element is enveloped by an encapsulant.

In some embodiments, the techniques described herein relate to a cooling structure, wherein a heat spreader is disposed on a top surface of the encapsulant, wherein the top surface of the encapsulant is disposed on a side of the first element opposite the semiconductor element.

In some embodiments, the techniques described herein relate to a cooling structure, where the heat spreader includes a metal.

In some embodiments, the techniques described herein relate to a cooling structure, wherein a coefficient of thermal expansion of the first element and the second element match a coefficient of thermal expansion of the semiconductor element.

In some embodiments, the techniques described herein relate to a cooling structure, wherein the semiconductor element includes one of a semiconductor wafer or a semiconductor die.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only and are not intended to limit the scope of the disclosure. Indeed, the novel apparatus, methods, and systems described herein may be embodied in a variety of other forms; furthermore, various omissions, substitutions, and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A cooling structure comprising:
    a semiconductor structure having a bonding surface directly bonded to an integrated device die and a back surface opposite the bonding surface, the semiconductor structure comprising:
    a plurality of cavities extending into the semiconductor structure from the bonding surface; and
    a plurality of nozzles, each nozzle of the plurality of nozzles disposed over and in fluid communication with a corresponding cavity of the plurality of cavities.

2. The cooling structure of claim 1, wherein each nozzle of the plurality of nozzles joins with the corresponding cavity at an orifice, the orifice narrower than the corresponding cavity.

3. The cooling structure of claim 1, wherein the semiconductor structure comprises a first element and a second element directly bonded to the first element without an intervening adhesive.

4. The cooling structure of claim 3, wherein the first element includes an inlet, an outlet, and a first plurality of channels in fluid communication with the plurality of nozzles, and wherein the second element includes a second plurality of channels and the plurality of nozzles.

5. The cooling structure of claim 4, wherein the plurality of nozzles is tapered to have wider openings on a first side and narrower openings on a second side, wherein the narrower openings are in fluid communication with the plurality of cavities.

6. The cooling structure of claim 5, wherein a tapered shape of the plurality of nozzles is characteristic of a wet-etched single crystal material of the semiconductor structure.

7. A cooling structure comprising:
    an inlet;
    a first element;
    a second element; and
    an outlet,
    wherein the first element comprises the inlet and a first cavity,
    wherein the second element comprises a plurality of nozzles on a first side and a second cavity on a second side opposite the first side,
    wherein a bottom surface of the first element is disposed on a top surface of the second element,
    wherein the cooling structure is configured to allow a liquid to flow from the inlet into the first cavity, from the first cavity into the plurality of nozzles, from the plurality of nozzles into the second cavity, and from the second cavity to the outlet.

8. The cooling structure of claim 7, wherein the first cavity comprises a first plurality of channels and at least one support structure, wherein the second cavity comprises a second plurality of channels and at least one support structure.

9. The cooling structure of claim 7, wherein the plurality of nozzles is exposed to the first cavity on a first side of the plurality of nozzles and to the second cavity on a second side of the plurality of nozzles, wherein the first side of the plurality of nozzles has an opening size that is greater than an opening size of the second side of the plurality of nozzles.

10. The cooling structure of claim 9, wherein the plurality of nozzles comprises one or more sidewalls having surfaces characteristic of formation by wet etching.

11. The cooling structure of claim 8, wherein the cooling structure is directly bonded to a semiconductor element, and wherein an exposed outer surface of the first element and the second element is enveloped by an encapsulant.

12. The cooling structure of claim 11, wherein a heat spreader is disposed on a top surface of the encapsulant, wherein the top surface of the encapsulant is disposed on a side of the first element opposite the semiconductor element.

* * * * *